United States Patent
Tomita et al.

(10) Patent No.: US 9,384,860 B2
(45) Date of Patent: Jul. 5, 2016

(54) SEMICONDUCTOR MEMORY OF WHICH DEFECTIVE CELL IS REPLACEABLE WITH REDUNDANT CELL AND MANUFACTURING METHOD OF SEMICONDUCTOR MEMORY

(71) Applicant: FUJITSU LIMITED, Kawasaki-shi, Kanagawa (JP)

(72) Inventors: Yoshinori Tomita, Kawasaki (JP); Hidetoshi Matsuoka, Kawasaki (JP); Hiroyuki Higuchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/331,401

(22) Filed: Jul. 15, 2014

(65) Prior Publication Data

US 2014/0321222 A1 Oct. 30, 2014

Related U.S. Application Data

(62) Division of application No. 13/137,672, filed on Sep. 1, 2011, now abandoned.

(30) Foreign Application Priority Data

Dec. 15, 2010 (JP) .................................. 2010-279718

(51) Int. Cl.
*G11C 7/00* (2006.01)
*G11C 29/00* (2006.01)
*H01L 21/66* (2006.01)

(52) U.S. Cl.
CPC ............ *G11C 29/808* (2013.01); *G11C 29/846* (2013.01); *G11C 29/848* (2013.01); *H01L 22/20* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,067,259 A | 5/2000 | Handa et al. | |
| 6,094,386 A | 7/2000 | Kohyama | |
| 6,307,794 B1 | 10/2001 | Haga | |
| 8,238,177 B2 | 8/2012 | Yamauchi | |
| 2007/0159884 A1 | 7/2007 | Yoshida et al. | |
| 2008/0084771 A1 | 4/2008 | Kajigaya | |

(Continued)

FOREIGN PATENT DOCUMENTS

| | | |
|---|---|---|
| JP | 54-119846 | 9/1979 |
| JP | 57-201000 | 12/1982 |

(Continued)

OTHER PUBLICATIONS

Taiwanese Office Action issued Jun. 10, 2014 in corresponding Taiwanese Patent Application No. 100132445.

(Continued)

*Primary Examiner* — Kretelia Graham
(74) *Attorney, Agent, or Firm* — Staas & Halsey LLP

(57) ABSTRACT

A semiconductor memory includes a memory cell array that includes data cells of x bits and redundant cells of y bits for each word; a position-data storage unit that stores, for each word, defective-cell position data of defective cells of the data cells and the redundant cells; and a read circuit that reads data from cells of x bits based on the defective-cell position data stored in the position-data storage unit for a specified word of which address is specified as read address, the cells of x bits being formed by the data cells of x bits and the redundant cells of y bits of the specified word other than the defective cells.

4 Claims, 30 Drawing Sheets

(56) References Cited

U.S. PATENT DOCUMENTS

2010/0254205 A1* 10/2010 Yamauchi ............ 365/200
2010/0322023 A1   12/2010 Matsuo

FOREIGN PATENT DOCUMENTS

| JP | 58-047798 | 10/1983 |
| JP | 63-239546 | 10/1988 |
| JP | 08-008344 | 1/1996 |
| JP | 10-209302 | 8/1998 |
| JP | 11-017019 | 1/1999 |
| JP | 2000-100191 | 4/2000 |
| JP | 2000-123593 | 4/2000 |
| JP | 2001-006389 | 1/2001 |
| JP | 2001-067889 | 3/2001 |
| JP | 2003-331597 | 11/2003 |
| JP | 2008-097675 | 4/2008 |
| JP | 2011-003256 | 1/2011 |

OTHER PUBLICATIONS

U.S. Appl. No. 13/137,672, filed Sep. 1, 2011, Yoshinori Tomita, et al., Fujitsu Limited.
Office Action issued Apr. 10, 2014 in U.S. Appl. No. 13/137,672.
Office Action issued Dec. 5, 2013 in U.S. Appl. No. 13/137,672.
Japanese Office Action mailed Jun. 24, 2014 for corresponding Japanese Patent Application No. 2010-279718.

* cited by examiner

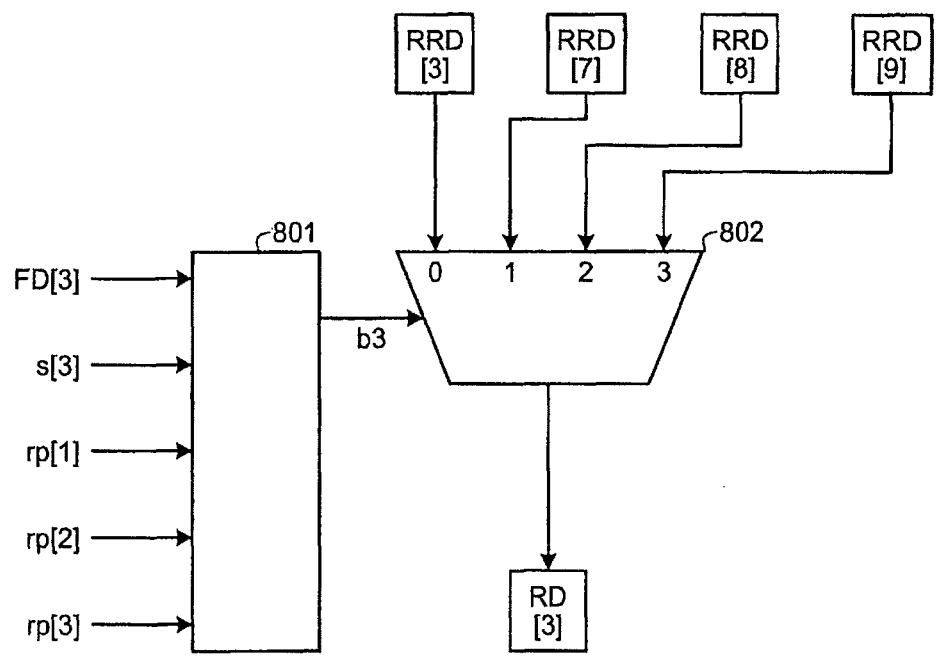

// 4to1 SELECTOR
RD[0] = SELECT( {RRD[0],RRD[7],RRD[8],RRD[9]}, b0 );
RD[1] = SELECT( {RRD[1],RRD[7],RRD[8],RRD[9]}, b1 );
RD[2] = SELECT( {RRD[2],RRD[7],RRD[8],RRD[9]}, b2 );
RD[3] = SELECT( {RRD[3],RRD[7],RRD[8],RRD[9]}, b3 );
RD[4] = SELECT( {RRD[4],RRD[7],RRD[8],RRD[9]}, b4 );
RD[5] = SELECT( {RRD[5],RRD[7],RRD[8],RRD[9]}, b5 );
RD[6] = SELECT( {RRD[6],RRD[7],RRD[8],RRD[9]}, b6 );
```

FIG.11

```
s0 = FD[0];       // 0 <= s0 <= 1
s1 = FD[1] + s0;  // 0 <= s1 <= 2
s2 = FD[2] + s1;  // 0 <= s2 <= 3
s3 = FD[3] + s2;  // 0 <= s3 <= 3
s4 = FD[4] + s3;  // 0 <= s4 <= 3
s5 = FD[5] + s4;  // 0 <= s5 <= 3
s6 = FD[6] + s5;  // 0 <= s6 <= 3 if (      FD[0] == 1 ) { RS0 = 0;
} else if ( FD[1] == 1 ) { RS0 = 1;
} else if ( FD[2] == 1 ) { RS0 = 2;
} else if ( FD[3] == 1 ) { RS0 = 3;
} else if ( FD[4] == 1 ) { RS0 = 4;
} else if ( FD[5] == 1 ) { RS0 = 5;
} else if ( FD[6] == 1 ) { RS0 = 6;
} else                   { RS0 = dontcare;
} if (      s0 == 1 && FD[1] == 1 ) { RS1 = 1;
} else if ( s1 == 1 && FD[2] == 1 ) { RS1 = 2;
} else if ( s2 == 1 && FD[3] == 1 ) { RS1 = 3;
} else if ( s3 == 1 && FD[4] == 1 ) { RS1 = 4;
} else if ( s4 == 1 && FD[5] == 1 ) { RS1 = 5;
} else if ( s5 == 1 && FD[6] == 1 ) { RS1 = 6;
} else                              { RS1 = dontcare;
} if (      s1 == 2 && FD[2] == 1 ) { RS2 = 2;
} else if ( s2 == 2 && FD[3] == 1 ) { RS2 = 3;
} else if ( s3 == 2 && FD[4] == 1 ) { RS2 = 4;
} else if ( s4 == 2 && FD[5] == 1 ) { RS2 = 5;
} else if ( s5 == 2 && FD[6] == 1 ) { RS2 = 6;
} else                              { RS2 = dontcare;
} d0 = SELECT( WD[0:6], RS0 );
d1 = SELECT( WD[0:6], RS1 );
d2 = SELECT( WD[0:6], RS2 );

RWD[0] = WD[0];
RWD[1] = WD[1];
RWD[2] = WD[2];
RWD[3] = WD[3];
RWD[4] = WD[4];
RWD[5] = WD[5];
RWD[6] = WD[6];
RWD[7] = d0;
RWD[8] = ( FD[7]==1 ) ? d0 : d1;
RWD[9] = ( FD[7]==1 && FD[8]==1 ) ? d0 : ( FD[7]==1 && FD[8]==0
      || FD[7]==0 && FD[8]==1 ) ? d1 : d2;
```

// RD[0]
b0 = (FD[0]==0) ? 0 : (FD[1]==0) ? 1 : (FD[2]==0) ? 2 : 3;
RD[0]  = SELECT( {RRD[0],RRD[1],RRD[2],RRD[3]}, b0 );

// RD[1]
if ( s0 == 0 ) {
    b1 = (FD[1]==0) ? 1 : (FD[2]==0) ? 2 : (FD[3]==0) ? 3 : 4;
} else { // s0==1
    b1 = (FD[2]==0) ? 2 : (FD[3]==0) ? 3 : 4;
}
RD[1]  = SELECT( {RRD[1],RRD[2],RRD[3],RRD[4]}, b1-1 );
```

FIG.15

```
// RD[2]
if ( s1 == 0 ) {
    b2 = (FD[2]==0) ? 2 : (FD[3]==0) ? 3 : (FD[4]==0) ? 4 : 5;
} else if ( s1 == 1 ) {
    b2 = (FD[3]==0) ? 3 : (FD[4]==0) ? 4 : 5;
} else { // s1==2
    b2 = (FD[4]==0) ? 4 : 5;
}

RD[2]  = SELECT( {RRD[2],RRD[3],RRD[4],RRD[5]}, b2-2 );

// RD[3]
if ( s2 == 0 ) {
    b3 = (FD[3]==0) ? 3 : (FD[4]==0) ? 4 : (FD[5]==0) ? 5 : 6;
} else if ( s2 == 1 ) {
    b3 = (FD[4]==0) ? 4 : (FD[5]==0) ? 5 : 6;
} else if ( s2 == 2 ) {
    b3 = (FD[5]==0) ? 5 : 6;
} else { // s2 == 3
    b3 = 6;
}

RD[3]  = SELECT( {RRD[3],RRD[4],RRD[5],RRD[6]}, b3-3 );

```
// RD[6]
if ( s5 == 0 ) {
    b6 = (FD[6]==0) ? 6 : (FD[7]==0) ? 7 : (FD[8]==0) ? 8 : 9;
} else if ( s5 == 1 ) {
    b6 = (FD[7]==0) ? 7 : (FD[8]==0) ? 8 : 9;
} else if ( s5 == 2 ) {
    b6 = (FD[8]==0) ? 8 : 9;
} else { // s5 == 3
    b6 = 9;
}

RD[6]  = SELECT( {RRD[6],RRD[7],RRD[8],RRD[9]}, b6-6 );
```

FIG.17

```
if ( s[i-1] == 0 ) {
    bi = (FD[i]==0) ? 0 : (FD[i+1]==0) ? 1 : (FD[i+2]==0) ? 2 : 3;
} else if ( s[i-1] == 1 ) {
    bi = (FD[i+1]==0) ? 1 : (FD[i+2]==0) ? 2 : 3;
} else if ( s[i-1] == 2 ) {
    bi = (FD[i+2]==0) ? 2 : 3;
} else { // s[i-1] == 3
    bi = 3;
}
RD[i] = SELECT( {RRD[i],RRD[i+1],RRD[i+2],RRD[i+3]}, bi );
```

```
s0 = FD[0];      // 0 <= s0 <= 1
s1 = FD[1] + s0; // 0 <= s1 <= 2
s2 = FD[2] + s1; // 0 <= s2 <= 3
s3 = FD[3] + s2; // 0 <= s3 <= 3
s4 = FD[4] + s3; // 0 <= s4 <= 3
s5 = FD[5] + s4; // 0 <= s5 <= 3
s6 = FD[6] + s5; // 0 <= s6 <= 3
s7 = FD[7] + s6; // 0 <= s7 <= 3
s8 = FD[8] + s7; // 0 <= s8 <= 3

RWD[9] = SELECT( {   0,    0,    0,WD[6]}, s8 );
RWD[8] = SELECT( {   0,    0,WD[6],WD[5]}, s7 );
RWD[7] = SELECT( {   0,WD[6],WD[5],WD[4]}, s6 );

RWD[6] = SELECT( {WD[6],WD[5],WD[4],WD[3]}, s5 );
RWD[5] = SELECT( {WD[5],WD[4],WD[3],WD[2]}, s4 );
RWD[4] = SELECT( {WD[4],WD[3],WD[2],WD[1]}, s3 );
RWD[3] = SELECT( {WD[3],WD[2],WD[1],WD[0]}, s2 );
RWD[2] = SELECT( {WD[2],WD[1],WD[0],   0}, s1 );
RWD[1] = SELECT( {WD[1],WD[0],   0,    0}, s0 );
RWD[0] = SELECT( {WD[0],   0,    0,    0}, 0 );
```

FIG.25

| MEMORY ARRAY | | CODING TECHNOLOGY 1 | | CODING TECHNOLOGY 2 | | CODING TECHNOLOGY 3 | | |
|---|---|---|---|---|---|---|---|---|
| x | y | BIT WIDTH OF 1 WORD | OVERHEAD | BIT WIDTH OF 1 WORD | OVERHEAD | NUMBER OF COMBINATIONS | BIT WIDTH OF 1 WORD | OVERHEAD |
| 7 | 3 | 10 | 100% | 12 | 120% | 120 | 7 | 70% |
| 10 | 3 | 13 | 100% | 12 | 92% | 286 | 9 | 69% |
| 32 | 4 | 36 | 100% | 24 | 67% | 58905 | 16 | 44% |
| 32 | 3 | 35 | 100% | 18 | 51% | 6545 | 13 | 37% |
| 32 | 2 | 34 | 100% | 12 | 35% | 561 | 10 | 29% |
| 36 | 4 | 40 | 100% | 24 | 60% | 91390 | 17 | 43% |
| 36 | 3 | 39 | 100% | 18 | 46% | 9139 | 14 | 36% |
| 36 | 2 | 38 | 100% | 12 | 32% | 703 | 10 | 26% |
| 72 | 18 | 90 | 100% | 126 | 140% | 3.7896E+18 | 62 | 69% |
| 72 | 7 | 79 | 100% | 49 | 62% | 2.899E+09 | 32 | 41% |
| 72 | 6 | 78 | 100% | 42 | 54% | 256851595 | 28 | 36% |
| 72 | 5 | 77 | 100% | 35 | 45% | 19757815 | 25 | 32% |
| 72 | 4 | 76 | 100% | 28 | 37% | 1282975 | 21 | 28% |
| 72 | 3 | 75 | 100% | 21 | 28% | 67525 | 17 | 23% |
| 72 | 2 | 74 | 100% | 14 | 19% | 2701 | 12 | 16% |
| 72 | 1 | 73 | 100% | 7 | 10% | 73 | 7 | 10% |

FIG.27

| CODE DATA | 0 | 1 | 2 | 3 | 4 | 5 | 6 | 7 | 8 | 9 | | CODE DATA | 0 | 1 | 2 | 3 | 4 | 5 | 6 | 7 | 8 | 9 | | CODE DATA | 0 | 1 | 2 | 3 | 4 | 5 | 6 | 7 | 8 | 9 |
|---|---|---|---|---|---|---|---|---|---|---|---|---|---|---|---|---|---|---|---|---|---|---|---|---|---|---|---|---|---|---|---|---|---|---|
| 0 | x | x | x | | | | | | | | | 40 | | x | x | | | | | x | | | | 80 | | | x | | | | x | | x | |
| 1 | x | x | | x | | | | | | | | 41 | | x | x | | | | | | x | | | 81 | | | x | | | | x | | | x |
| 2 | x | x | | | x | | | | | | | 42 | | x | x | | | | | | | x | | 82 | | | x | | | | | x | x | |
| 3 | x | x | | | | x | | | | | | 43 | | x | | x | x | | | | | | | 83 | | | x | | | | | x | | x |
| 4 | x | x | | | | | x | | | | | 44 | | x | | x | | x | | | | | | 84 | | | x | | | | | | x | x |
| 5 | x | x | | | | | | x | | | | 45 | | x | | x | | | x | | | | | 85 | | | | x | x | x | | | | |
| 6 | x | x | | | | | | | x | | | 46 | | x | | x | | | | x | | | | 86 | | | | x | x | | x | | | |
| 7 | x | x | | | | | | | | x | | 47 | | x | | x | | | | | x | | | 87 | | | | x | x | | | x | | |
| 8 | x | | x | x | | | | | | | | 48 | | x | | x | | | | | | x | | 88 | | | | x | x | | | | x | |
| 9 | x | | x | | x | | | | | | | 49 | | x | | | x | x | | | | | | 89 | | | | x | x | | | | | x |
| 10 | x | | x | | | x | | | | | | 50 | | x | | | x | | x | | | | | 90 | | | | x | | x | x | | | |
| 11 | x | | x | | | | x | | | | | 51 | | x | | | x | | | x | | | | 91 | | | | x | | x | | x | | |
| 12 | x | | x | | | | | x | | | | 52 | | x | | | x | | | | x | | | 92 | | | | x | | x | | | x | |
| 13 | x | | x | | | | | | x | | | 53 | | x | | | x | | | | | x | | 93 | | | | x | | x | | | | x |
| 14 | x | | x | | | | | | | x | | 54 | | x | | | | x | x | | | | | 94 | | | | x | | | x | x | | |
| 15 | x | | | x | x | | | | | | | 55 | | x | | | | x | | x | | | | 95 | | | | x | | | x | | x | |
| 16 | x | | | x | | x | | | | | | 56 | | x | | | | x | | | x | | | 96 | | | | x | | | x | | | x |
| 17 | x | | | x | | | x | | | | | 57 | | x | | | | x | | | | x | | 97 | | | | x | | | | x | x | |
| 18 | x | | | x | | | | x | | | | 58 | | x | | | | | x | x | | | | 98 | | | | x | | | | x | | x |
| 19 | x | | | x | | | | | x | | | 59 | | x | | | | | x | | x | | | 99 | | | | x | | | | | x | x |
| 20 | x | | | x | | | | | | x | | 60 | | x | | | | | x | | | x | | 100 | | | | | x | x | x | | | |
| 21 | x | | | | x | x | | | | | | 61 | | x | | | | | | x | x | | | 101 | | | | | x | x | | x | | |
| 22 | x | | | | x | | x | | | | | 62 | | x | | | | | | x | | x | | 102 | | | | | x | x | | | x | |
| 23 | x | | | | x | | | x | | | | 63 | | x | | | | | | | x | x | | 103 | | | | | x | x | | | | x |
| 24 | x | | | | x | | | | x | | | 64 | | | x | x | x | | | | | | | 104 | | | | | x | | x | x | | |
| 25 | x | | | | x | | | | | x | | 65 | | | x | x | | x | | | | | | 105 | | | | | x | | x | | x | |
| 26 | x | | | | | x | x | | | | | 66 | | | x | x | | | x | | | | | 106 | | | | | x | | x | | | x |
| 27 | x | | | | | x | | x | | | | 67 | | | x | x | | | | x | | | | 107 | | | | | x | | | x | x | |
| 28 | x | | | | | x | | | x | | | 68 | | | x | x | | | | | x | | | 108 | | | | | x | | | x | | x |
| 29 | x | | | | | x | | | | x | | 69 | | | x | x | | | | | | x | | 109 | | | | | x | | | | x | x |
| 30 | x | | | | | | x | x | | | | 70 | | | x | | x | x | | | | | | 110 | | | | | | x | x | x | | |
| 31 | x | | | | | | x | | x | | | 71 | | | x | | x | | x | | | | | 111 | | | | | | x | x | | x | |
| 32 | x | | | | | | x | | | x | | 72 | | | x | | x | | | x | | | | 112 | | | | | | x | x | | | x |
| 33 | x | | | | | | | x | x | | | 73 | | | x | | x | | | | x | | | 113 | | | | | | x | | x | x | |
| 34 | x | | | | | | | x | | x | | 74 | | | x | | x | | | | | x | | 114 | | | | | | x | | x | | x |
| 35 | x | | | | | | | | x | x | | 75 | | | x | | | x | x | | | | | 115 | | | | | | x | | | x | x |
| 36 | | x | x | x | | | | | | | | 76 | | | x | | | x | | x | | | | 116 | | | | | | | x | x | x | |
| 37 | | x | x | | x | | | | | | | 77 | | | x | | | x | | | x | | | 117 | | | | | | | x | x | | x |
| 38 | | x | x | | | x | | | | | | 78 | | | x | | | x | | | | x | | 118 | | | | | | | x | | x | x |
| 39 | | x | x | | | | x | | | | | 79 | | | x | | | | x | x | | | | 119 | | | | | | | | x | x | x |

SEMICONDUCTOR MEMORY OF WHICH DEFECTIVE CELL IS REPLACEABLE WITH REDUNDANT CELL AND MANUFACTURING METHOD OF SEMICONDUCTOR MEMORY

CROSS REFERENCE TO RELATED APPLICATIONS

This application is a divisional of U.S. application Ser. No. 13/137,672 filed Sep. 1, 2011, which is based upon and claims the benefit of priority of the prior Japanese Patent Application No. 2010-279718, filed on Dec. 15, 2010, the disclosure of all of which are incorporated herein by reference.

FIELD

The embodiments discussed herein are related to a semiconductor memory that stores data and a manufacturing method.

BACKGROUND

For normal operation of a static random access memory (SRAM) macro that is configured by a vast number of cells, a technology that replaces a defective cell with a redundant cell is known. For example, a cell becomes defective due to foreign particle contamination during manufacturing. A cell also becomes defective due to marginality caused by manufacturing variation, in other words, an insufficient margin for source voltage, temperature, etc., required for operation. For example, a cell does not operate if the source voltage is low.

In the above technology, all cells of 1 word (or 1 column) having a defective cell are replaced with redundant cells of 1 word (or 1 column) (hereinafter, "conventional art 1." See, for example, Japanese Laid-Open Patent Publication Nos. 2001-67889 and 2003-331597). In the above technology, a redundant cell of 1 column and a read only memory (ROM) that stores position data of a defective cell of 1 bit are provided for each word of a dynamic random access memory (DRAM), and 1 defective cell is replaced with the redundant cell of each word (hereinafter, "conventional art 2." See, for example, Japanese Laid-Open Patent Publication No. H11-17019).

Recently, however, the source voltage of semiconductor memory has been reduced for lower power consumption, which causes multiple cells to be defective in multiple words and/or in each word due to the marginality.

The conventional art 1 can replace 1 word or 1 column with a redundant word or a redundant column, but cannot if defective cells are in multiple words or multiple columns.

FIG. 36 is a schematic of an example of the conventional art 2. The DRAM cell array depicted in FIG. 36 includes 18 words (rows), 16 bits (columns) of data cells, and 1 column of redundant cells (redundant column). For example, 2 cells indicated by "x" are defective in a specified word. However, only one of the cells can be replaced with the redundant cell, while the other cannot be replaced. As a result, the DRAM becomes defective.

FIG. 37 is a schematic of another example of the conventional art 2. The DRAM cell array depicted in FIG. 37 is that depicted in FIG. 36 to which 1 redundant column is added. To add 1 redundant column, the memory cell array is divided into 2 blocks each of which includes 1 redundant column since data are read from/written into the DRAM cell array in units of bits. If multiple cells are defective in the specified word of the memory cell array on the left, only one of the cells can be replaced with the redundant cell while the other(s) cannot be replaced. As a result, the DRAM becomes defective.

SUMMARY

According to an aspect of an embodiment, a semiconductor memory includes a memory cell array that includes data cells of x bits and redundant cells of y bits for each word; a position-data storage unit that stores, for each word, defective-cell position data of defective cells of the data cells and the redundant cells; and a read circuit that reads data from cells of x bits based on the defective-cell position data stored in the position-data storage unit for a specified word of which address is specified as read address, the cells of x bits being formed by the data cells of x bits and the redundant cells of y bits of the specified word other than the defective cells.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a schematic of an example of a truth table of a logic circuit 601.

FIG. 8 is a second schematic of the example of the read circuit 200 according to the first example.

FIG. 9 is a schematic of an exemplary HDL description of the read circuit 200 according to the first example.

FIG. 11 is an example of HDL description of the write circuit 300 according to the first example.

FIG. 14 is a first schematic of an example of HDL description of the read circuit 200 according to the second example.

FIG. 15 is a second schematic of the example of HDL description of the read circuit 200 according to the second example.

FIG. 16 is a third schematic of the example of HDL description of the read circuit 200 according to the second example.

FIG. 17 is a schematic of an example of generalized RDs depicted in FIGS. 14 to 16.

FIG. 25 is a schematic of bit widths of defective-cell position data for each word according to coding technologies.

FIG. 27 is a schematic of an example of combination numbers of defective cell according to coding technology 3.

DESCRIPTION OF EMBODIMENTS

Preferred embodiments of the present invention will be explained with reference to the accompanying drawings. A semiconductor memory is described in a first and a second embodiment, and a manufacturing method is described in a third embodiment. In the first embodiment, an example is described in which data having the bit width of data cells are read from data cells and redundant cells of a specified word (excluding defective cells), respectively, based on defective-cell position data for the specified word stored in a position-data storage unit that stores defective-cell position data for each word. Further, an example is described in which write data for data cells are written into data cells and redundant cells, based on the defective-cell position data stored in the position-data storage unit. Detailed circuit examples are described using circuit diagrams with circuit symbols and/or hardware description language (HDL) description. In the first embodiment, the defective-cell position data are, for example, a bit string has a bit width of data cells and redundant cells and indicates whether the respective cells are defective.

In the second embodiment, an example of the defective-cell position data that are coded according to a method different from the first embodiment is described. In the third embodiment, an example is described in which the defective-cell position data are written into the position-data storage unit of the semiconductor memory described in the first and the second embodiments by electron beam exposure.

Figure 1:
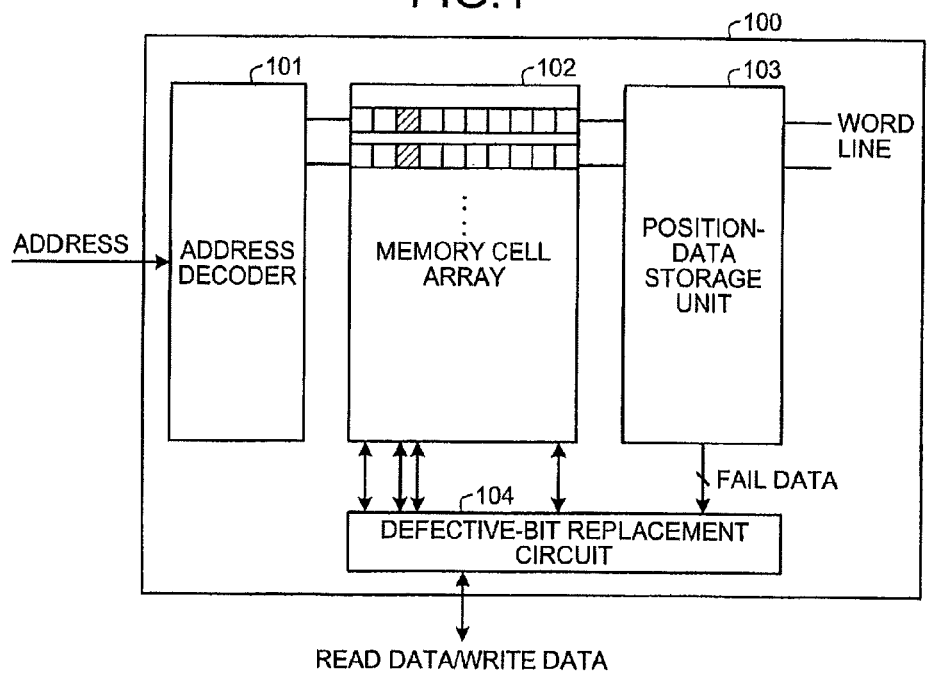
FIG. 1 is a schematic of a semiconductor memory according to a first embodiment.

FIG. 1 is a schematic of a semiconductor memory according to the first embodiment. A semiconductor memory 100 includes an address decoder 101, a memory cell array 102, a position-data storage unit 103, and a defective-bit replacement circuit 104. The semiconductor memory 100 may be a semiconductor memory enclosed in a package, or an Intellectual Property (IP) mounted on a system LSI, etc.

For example, the memory cell array 102 includes a data cell(s) of x bits (x≥1) and a redundant cell(s) of y bits (y≥1) for each word. The memory cell array 102 is, for example, a SRAM. For example, the address decoder 101 determines a word from/into which data are to be read/written (specified word) by decoding an input ADDRESS. For example, the position-data storage unit 103 is a read only memory that stores the defective-cell position data for each word. For example, the defective-bit replacement circuit 104 includes a read circuit and a write circuit.

Figure 2:
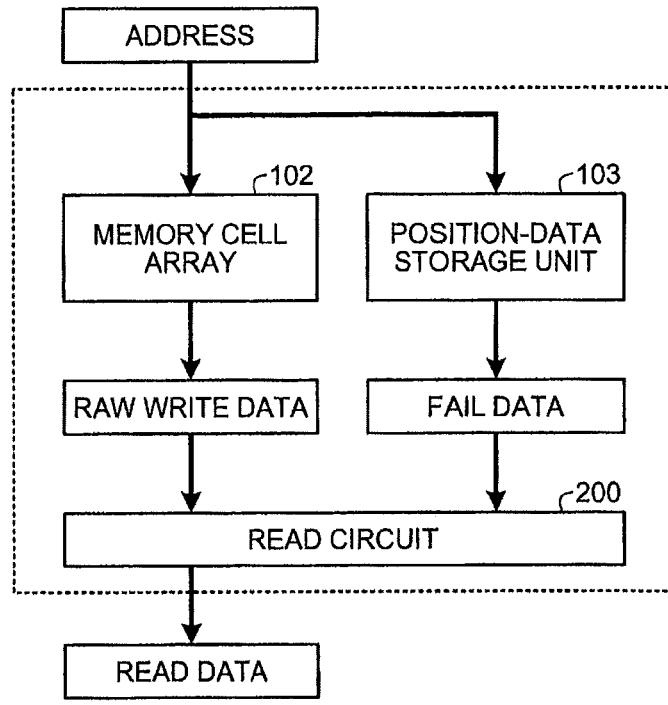
FIG. 2 is a schematic of an example of read performed by a defective-bit replacement circuit 104 according to the first embodiment.

FIG. 2 is a schematic of an example of read performed by the defective-bit replacement circuit 104 according to the first embodiment. Data of the word specified by ADDRESS included in a read command are output from the memory cell array 102 and the position-data storage unit 103. The memory cell array 102 outputs RAW READ DATA as the data of the specified word. Here, it is assumed that the memory cell array 102 includes data cells of 7 bits and redundant cells of 3 bits for each word. Thus, RAW READ DATA are data of 10 bits. The position-data storage unit 103 outputs FAIL DATA as the data of the specified word. FAIL DATA are the defective-cell position data. Here, the defective-cell position data are data of 10 bits indicating whether the cells are defective for each word.

A read circuit 200 of the defective-bit replacement circuit 104 outputs READ DATA of 7 bits obtained by removing defective cells from RAW READ DATA of 10 bits, based on FAIL DATA output from the position-data storage unit 103.

Figure 3:
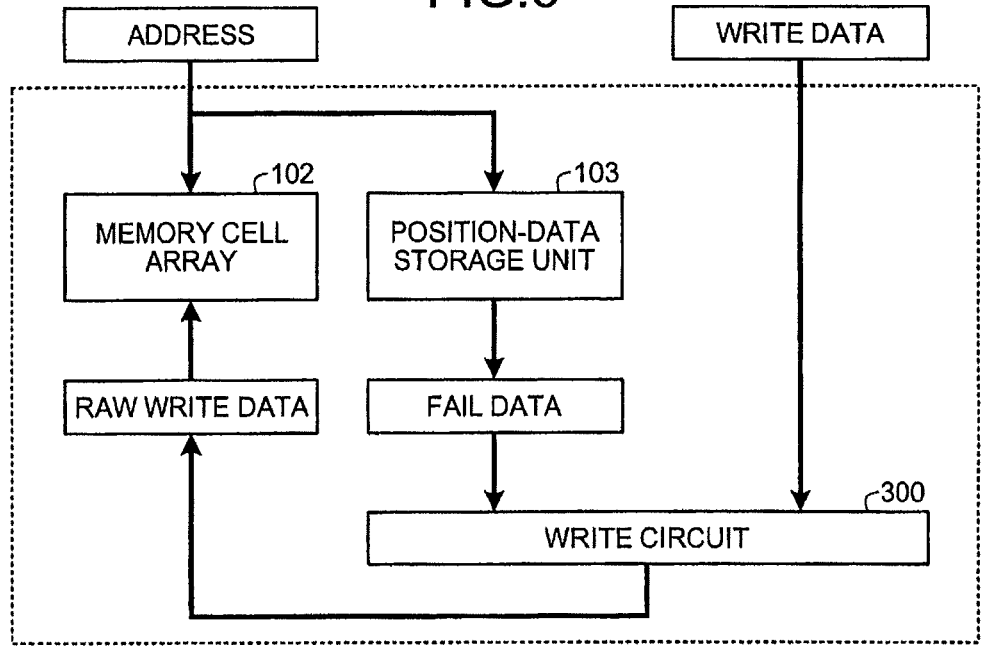
FIG. 3 is a schematic of an example of write performed by the defective-bit replacement circuit 104 according to the first embodiment.

FIG. 3 is a schematic of an example of write performed by the defective-bit replacement circuit 104 according to the first embodiment. The position-data storage unit 103 outputs data of the word specified by ADDRESS included in a write command. The position-data storage unit 103 outputs FAIL DATA as the defective-cell position data of the specified word. WRITE DATA are write data of 7 bits. A write circuit 300 of the defective-bit replacement circuit 104 replaces WRITE DATA with RAW WRITE DATA, based on FAIL DATA, and writes into data cells and redundant cells of the specified word in the memory cell array 102. Here, a defective cell(s) is also written; alternatively, configuration may be such that only cells other than the defective cell(s) are written.

A first example of the defective-bit replacement in which positions of redundant cells are fixed (fixed scheme) and a second example in which positions of redundant cells are shifted (shifted scheme) are described next.

Figure 4:
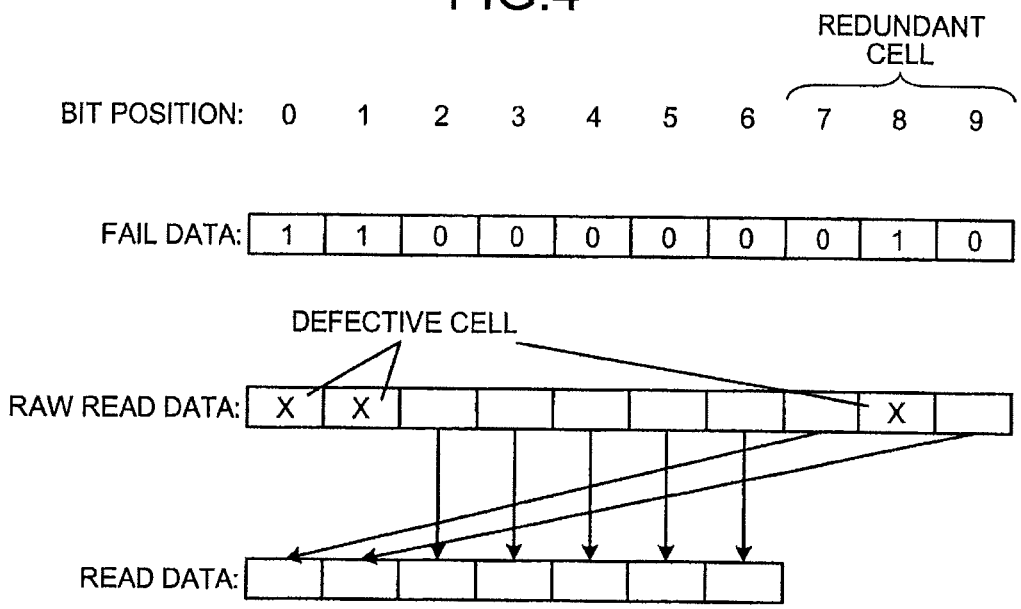
FIG. 4 is a schematic of a first example of the defective-bit replacement concerning read.

FIG. 4 is a schematic of the first example of the defective-bit replacement concerning read. In the fixed scheme, a redundant cell(s) is used in place of a defective cell(s), and bit positions of normal cells are not changed. In FIG. 4, for example, cells at bit positions where FAIL DATA is 1 are defective. For example, FAIL DATA indicate that cells at bit positions 0, 1, and 8 are defective. When the word is read, the semiconductor memory 100 outputs data of the cell at the bit position 7 as data of the cell at the bit position 0, and outputs data of the cell at the bit position 9 as data of the cell at the bit position 1.

The semiconductor memory 100 also outputs data of the cell at the bit position 2 as data of the cell at the bit position 2; outputs data of the cell at the bit position 3 as data of the cell at the bit position 3; outputs data of the cell at the bit position 4 as data of the cell at the bit position 4; outputs data of the cell at the bit position 5 as data of the cell at the bit position 5; and outputs data of the cell at the bit position 6 as data of the cell at the bit position 6.

Figure 5:
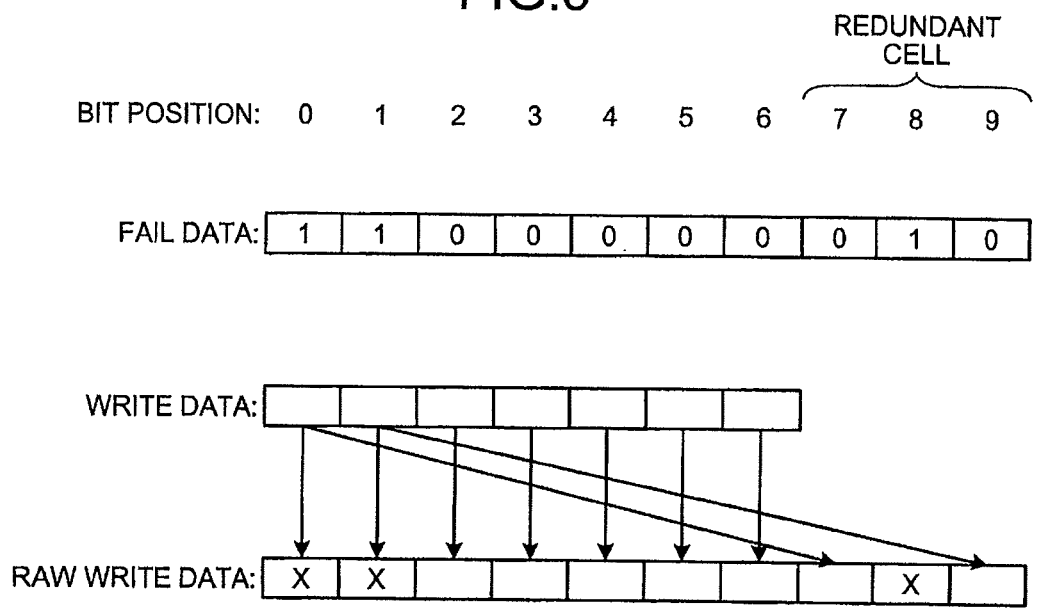
FIG. 5 is a schematic of the first example of the defective-bit replacement concerning write.

FIG. 5 is a schematic of the first example of the defective-bit replacement concerning write. FIG. 5 depicts a write of WRITE DATA into a word specified by the address. In FIG. 5, for example, cells at bit positions where FAIL DATA is 1 are defective. For example, FAIL DATA indicate that cells at bit positions 0, 1, and 8 are defective. When the word is written, the semiconductor memory 100 writes data of the 0th bit of WRITE DATA into the cell at the 7th bit, and writes data of the 1st bit of WRITE DATA into the cell at the 9th bit. Details of the read circuit 200 of the defective-bit replacement circuit 104 are described next with reference to FIGS. 6 and 9, and details of the write circuit 300 of the defective-bit replacement circuit 104 are described next with reference to FIGS. 10 and 11.

Figure 6:
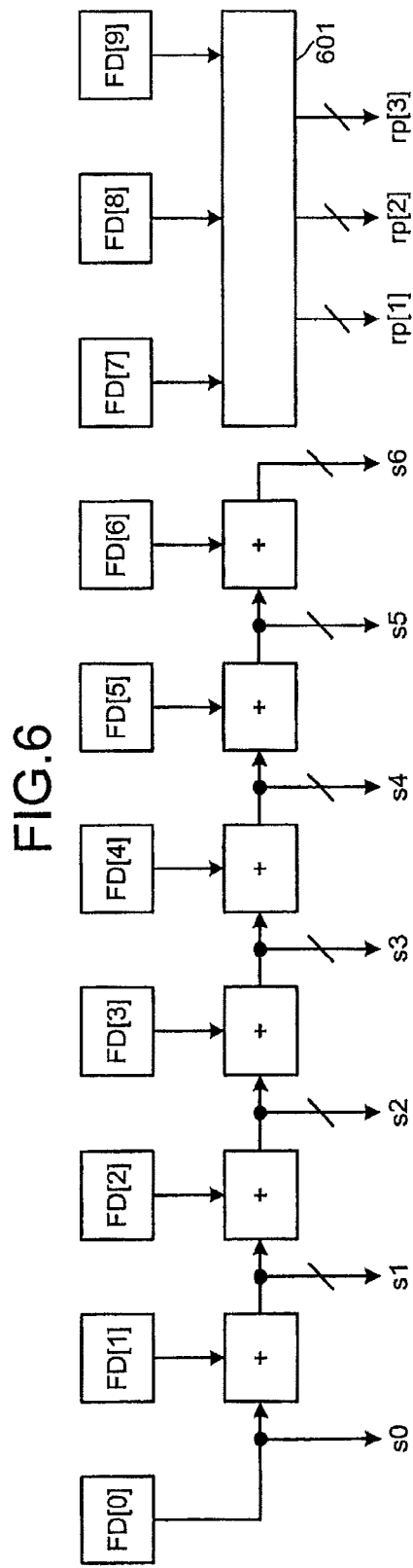
FIG. 6 is a first schematic of an example of a read circuit 200 according to the first example.

FIG. 6 is a first schematic of an example of the read circuit 200 according to the first example. FD[0:9] represents FAIL DATA[0:9]. RRD[0:9] represents RAW READ DATA[0:9].

FD[0] is s0, FD[0] plus FD[1] is s1, s1 plus FD[2] is s2, s2 plus FD[3] is s3, s3 plus FD[4] is s4, s4 plus FD[5] is s5, and s5 plus FD[6] is s6. A logic circuit 601 determines rp[1] to rp[3], based on FD[7] to FD[9]. Details of the logic circuit 601 are described with reference to FIG. 7.

FIG. 7 is a schematic of an example of a truth table of the logic circuit 601. In a truth table 700 of the logic circuit 601, FD[7] to FD[9] are inputs while Fo0 to Fo2 are outputs. The value of Fo0 becomes the value of rp[1], the value of Fo1 becomes the value of rp[2], and the value of Fo3 becomes the value of rp[3]. "*" represents "don't care" that can be either 0 or 1.

For example, if the value of FD[7] is 0, the value of FD[8] is 0, and the value of FD[9] is 0, the value of Fo0 becomes 1, the value of Fo1 becomes 2, the value of Fo2 becomes 3. If the value of FD[7] is 1, the value of FD[8] is 0, and the value of FD[9] is 0, the value of Fo0 becomes 2, the value of Fo1 becomes 3, the value of Fo2 becomes *. An example of determining RD, based on FD and rp is described next, taking RD[3] as an example from among RD[0] to RD[6].

FIG. 8 is a second schematic of the example of the read circuit 200 according to the first example. In FIG. 8, description is made taking RD[3] as an example from among RD[0] to RD[9]. A logic circuit 801 determines b3, based on FD[3], s3, and rp[1] to rp[3]. The logic circuit 801 will be described in detail in an example of HDL description of the read circuit 200. A selection circuit 802 determines RD[3], from among RRD[3], RRD[7], RRD[8], and RRD[9], based on b3. For example, the selection circuit 802 outputs the value of RRD[3] if b3 is 0 and outputs the value of RRD[7] if b3 is 1. The selection circuit 802 outputs the value of RRD[8] if b3 is 2 and outputs the value of RRD[9] if b3 is 3.

For example, the data cell at the 3rd bit is a defective cell if FD[3] is 1, and thus replaced with any one of the redundant cells from the 7th bit to the 9th bit. Thus, the read circuit 200 outputs the value of RRD[3] as RD[3] if FD[3] is 0, and outputs any one of values of RRD[7] to RRD[9] as RD[3] if FD[3] is 1.

FIG. 9 is a schematic of an exemplary HDL description of the read circuit 200 according to the first example. s0 to s6 are a part of the read circuit 200 depicted in FIG. 6. A process according to the truth table 700 depicted in FIG. 7 is performed for Fo0 to Fo2.

b3 is the same as b3 depicted in FIG. 8, and the logic circuit 801 is equivalent to the HDL description on the right side of b3 depicted in FIG. 9. b3 is 0 if FD[3] is 0, while b3 is rp[s3] if FD[3] is not 0. s3 is any one of 0 to 3. b0 to b2 and b4 to b6 are calculated in a similar manner to b3. The right member of RD[3] is equivalent to the selection circuit 802 depicted in FIG. 8. RD[0] to RD[2] and RD[4] to RD[6] are calculated in a similar manner to RD[3].

An example is described where FD[0] to FD[9] and RRD[0] to RRD[9] are as follows.
FD[0]=1
FD[1]=1
FD[2]=0
FD[3]=0
FD[4]=0
FD[5]=0
FD[6]=0
FD[7]=0
FD[8]=1
FD[9]=0
RRD[0]=x
RRD[1]=x
RRD[2]=0
RRD[3]=0
RRD[4]=1
RRD[5]=0
RRD[6]=0
RRD[7]=0
RRD[8]=x
RRD[9]=1

This indicates that the data cell at the 0th bit, the data cell at the 1st bit, and the redundant cell at the 8th bit are defective. s0 to s6 are described below.
s0=FD[0]=1
s1=FD[1]+s0=1+1=2
s2=FD[2]+s1=0+2=2
s3=FD[3]+s2=0+2=2
s4=FD[4]+s3=0+2=2
s5=FD[5]+s4=0+2=2
s6=FD[6]+s5=0+2=2

Since FD[7] is 0, FD[8] is 1, and FD[9] is 0, rp[1] to rp[3] are as follows.
rp[1]=1
rp[2]=3
rp[3]=*
  b0 to b7 are as follows.
b0=rp[s0]=1
b1=rp[s1]=3
b2=0
b3=0
b4=0
b5=0
b6=0
b7=0
  RD[0] to RD[6] are as follows.
RD[0]=RRD[7]=0
RD[1]=RRD[9]=1
RD[2]=RRD[2]=0
RD[3]=RRD[3]=0
RD[4]=RRD[4]=1
RD[5]=RRD[5]=0
RD[6]=RRD[6]=0

Figure 10:
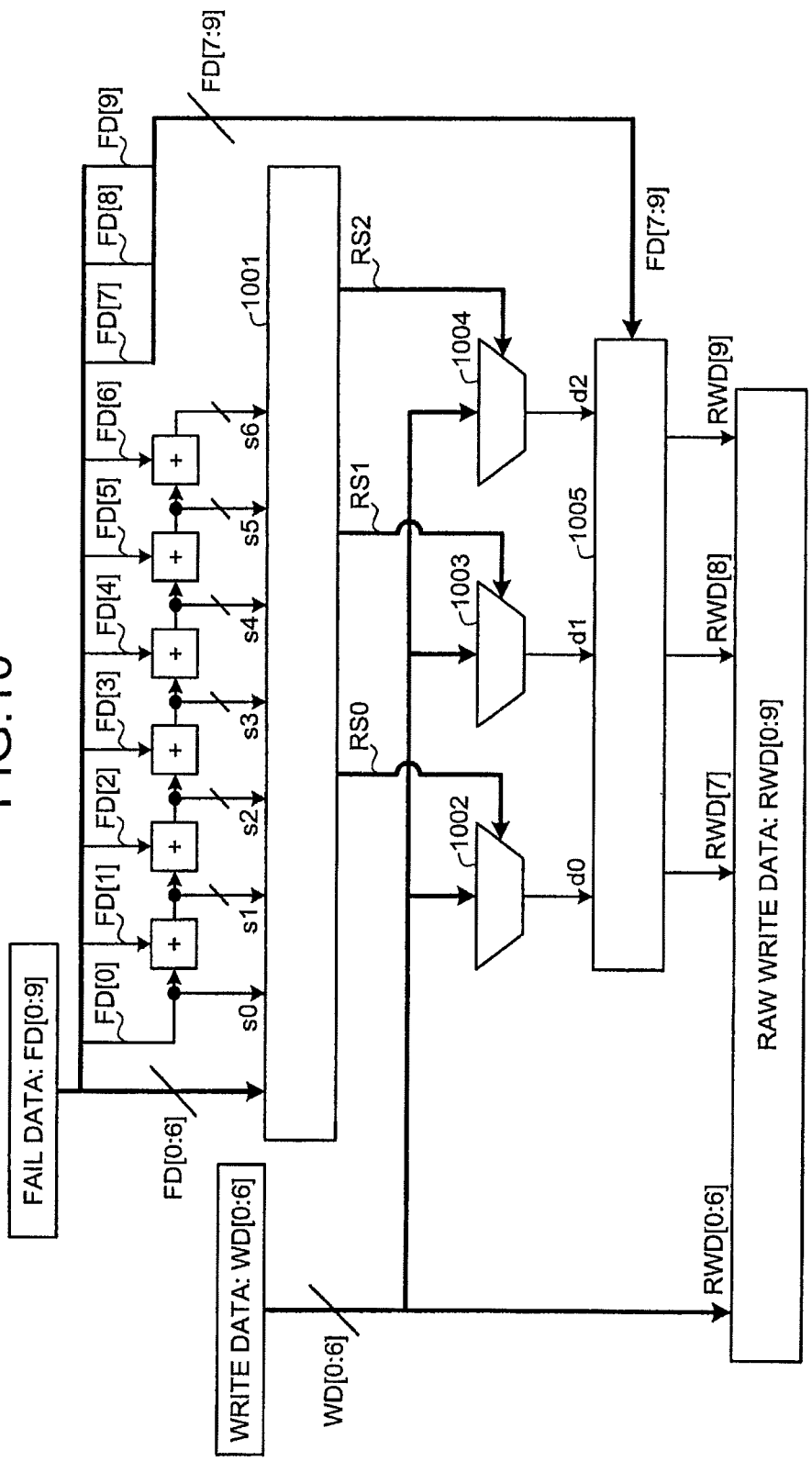
FIG. 10 is an example of a write circuit 300 according to the first example.

FIG. 10 is an example of the write circuit 300 according to the first example. FD[0:9] represents FAIL DATA[0:9].

WD[0:6] represents WRITE DATA[0:6]. s0 to s6 are the same as s0 to s6 depicted in FIG. 6, and thus detailed description is omitted.

A logic circuit 1001 determines RS0 to RS2, based on FD[0] to FD[6] and s0 to s6. Details of RS0 to RS2 will be described in an exemplary HDL description of the write circuit 300. A selection circuit 1002 outputs any one of the values of WD[0] to WD[6], based on RS0. For example, the selection circuit 1002 outputs the value of WD[0] as d0 if RS0 is 0 and outputs the value of WD[3] as d0 if RS0 is 3.

A selection circuit 1003 outputs any one of the values of WD[0] to WD[6] based on RS1. For example, the selection circuit 1003 outputs WD[1] as d1 if RS1 is 1 and outputs the value of WD[5] as d1 if RS1 is 5. A selection circuit 1004 outputs any one of the data of WD[0] to WD[6] based on RS2. For example, the selection circuit 1004 outputs WD[4] as d2 if RS2 is 4 and outputs WD[6] as d2 if RS2 is 6.

A logic circuit 1005 determines RWD[7] to RWD[9] based on d0 to d2 and FD[7:9]. Details of RWD[7:9] will be described in the exemplary HDL description. WD[0] to WD[6] are RWD[0] to RWD[6], respectively.

FIG. 11 is an example of HDL description of the write circuit 300 according to the first example. s0 to s6 are the same as s0 to s6 depicted in FIG. 6, and thus detailed description is omitted. Details of RS0 to RS2 and RWD[7] to RWD [9] depicted in FIG. 11 are described next. Assignment statements of RS0, RS1, and RS2 depicted in FIG. 11 represent the details of the logic circuit 1001 depicted in FIG. 10. Assignment statements of d0 to d3 depicted in FIG. 11 represent the selection circuit 1002 to the selection circuit 1004, respectively. Assignment statements of RWD[7] to RWD[9] depicted in FIG. 11 represent the details of the logic circuit 1005 depicted in FIG. 10.

RS0 is described first. RS0 is 0 if FD[0] is 1. RS0 is 1 if FD[0] is not 1 and FD[1] is 1. RS0 is 2 if FD[0] is not 1, FD[1] is not 1, and FD[2] is 1. RS0 is 3 if FD[0] is not 1, FD[1] is not 1, FD[2] is not 1, and FD[3] is 1. RS0 is 4 if FD[0] is not 1, FD[1] is not 1, FD[2] is not 1, FD[3] is not 1, and FD[4] is 1.

RS0 is 5 if FD[0] is not 1, FD[1] is not 1, FD[2] is not 1, FD[3] is not 1, FD[4] is not 1, and FD[5] is 1. RS0 is 6 if FD[0] is not 1, FD[1] is not 1, FD[2] is not 1, FD[3] is not 1, FD[4] is not 1, FD[5] is not 1, and FD[6] is 1. Otherwise, RS0 is "don't care."

RS1 is described next. RS1 is 1 if s0 is 1 and FD[1] is 1. RS1 is 2 if s1 is 1 and FD[2] is 1. RS1 is 3 if s2 is 1 and FD[3] is 1. RS1 is 4 if s3 is 1 and FD[4] is 1. RS1 is 5 if s4 is 1 and FD[5] is 1. RS1 is 6 if s5 is 1 and FD[6] is 1.

RS2 is described next. RS2 is 1 if s1 is 2 and FD[2] is 1. RS2 is 3 if s2 is 2 and FD[3] is 1. RS2 is 4 if s3 is 2 and FD[4] is 1. RS2 is 5 if s4 is 2 and FD[5] is 1. RS2 is 6 if s5 is 2 and FD[6] is 1.

d0 is any one of the values of WD[0] to WD[6] according to RS0. d1 is any one of the values of WD[0] to WD[6] according to RS1. d2 is any one of the values of WD[0] to WD[6] according to RS2.

It is assumed that RWD[0] to RWD[6] are WD[0] to WD[6], respectively. RWD[7] is d0. RWD[8] is d0 if FD[7] is 1, while d1 if FD[7] is not 1. RDW[9] is d0 if FD[7] is 1 and FD[8] is 1, d1 if FD[7] is 1 and FD[8] is 0 or FD[7] is 0 and FD[8] is 1, and otherwise d2.

An example is described where FD[0] to FD[9] and WD[0] to WD[6] are as follows.
FD[0]=1
FD[1]=1
FD[2]=0
FD[3]=0
FD[4]=0
FD[5]=0
FD[6]=0
FD[7]=0
FD[8]=1
FD[9]=0
WD[0]=1
WD[1]=1
WD[2]=0
WD[3]=0
WD[4]=1
WD[5]=0
WD[6]=1

This indicates that the data cell at the 0th bit, the data cell at the 1st bit, and the redundant cell at the 8th bit are defective. s0 to s6 are described below.
s0=FD[0]=1
s1=FD[1]+s0=1+1=2
s2=FD[2]+s1=0+2=2
s3=FD[3]+s2=0+2=2
s4=FD[4]+s3=0+2=2
s5=FD[5]+s4=0+2=2
s6=FD[6]+s5=0+2=2

Since FD[0] is 1, s0 is 1, and FD[1] is 1, RS0 to RS2 are as follows.
RS0=0
RS1=1
RS2=* (don't care)

Thus, d0 to d2 are as follows.
d0=WD[0]=1
d1=WD[1]=1
d2=*
RWD[0]=WD[0]=1
RWD[1]=WD[1]=1
RWD[2]=WD[2]=0
RWD[3]=WD[3]=0
RWD[4]=WD[4]=1
RWD[5]=WD[5]=0
RWD[6]=WD[6]=1
RWD[7]=d0=1
RWD[8]=d1=1
RWD[9]=d1=1

Figure 12:
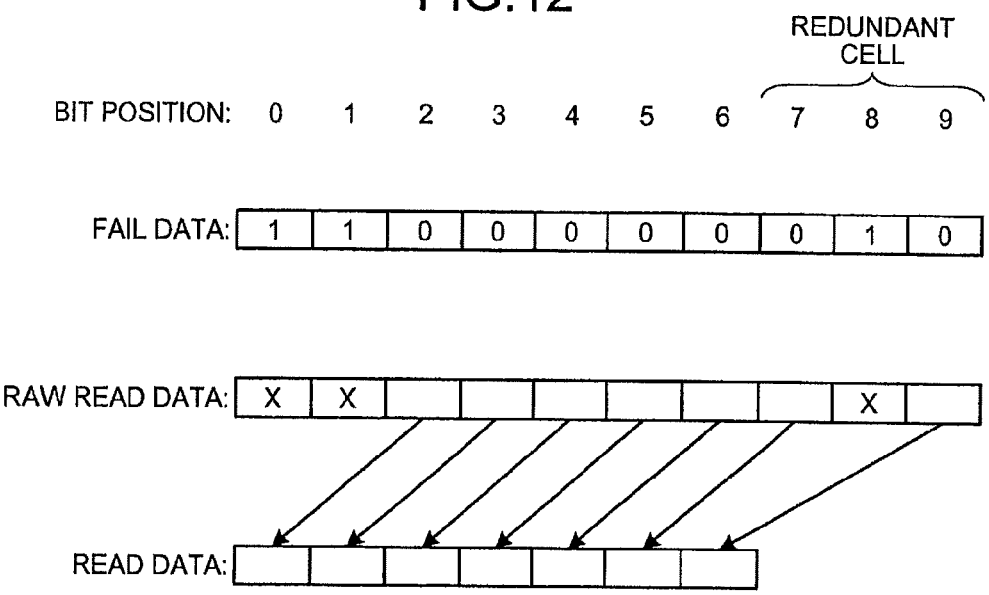
FIG. 12 is a schematic of a second example of the defective-bit replacement concerning read.

FIG. 12 is a schematic of the second example of the defective-bit replacement concerning read. In the shifted scheme, a redundant cell(s) is used in place of a defective cell(s), and cells other than the defective cell(s) are output in the order of bit position. In FIG. 12, for example, cells at bit positions where FAIL DATA of the specified word is 1 are defective. For example, FAIL DATA indicate that cells at bit positions 0, 1, and 8 are defective.

When the specified word is read, the semiconductor memory 100 outputs data of the cell at the bit position 2 as data of the cell at the bit position 0, while outputs data of the cell at the bit position 3 as data of the cell at the bit position 1. The semiconductor memory 100 outputs data of the cell at the bit position 4 as data of the cell at the bit position 2, while outputs data of the cell at the bit position 5 as data of the cell at the bit position 3. The semiconductor memory 100 outputs data of the cell at the bit position 6 as data of the cell at the bit position 4, outputs data of the cell at the bit position 7 as data of the cell at the bit position 5, and outputs data of the cell at the bit position 9 as data of the cell at the bit position 6.

Figure 13:
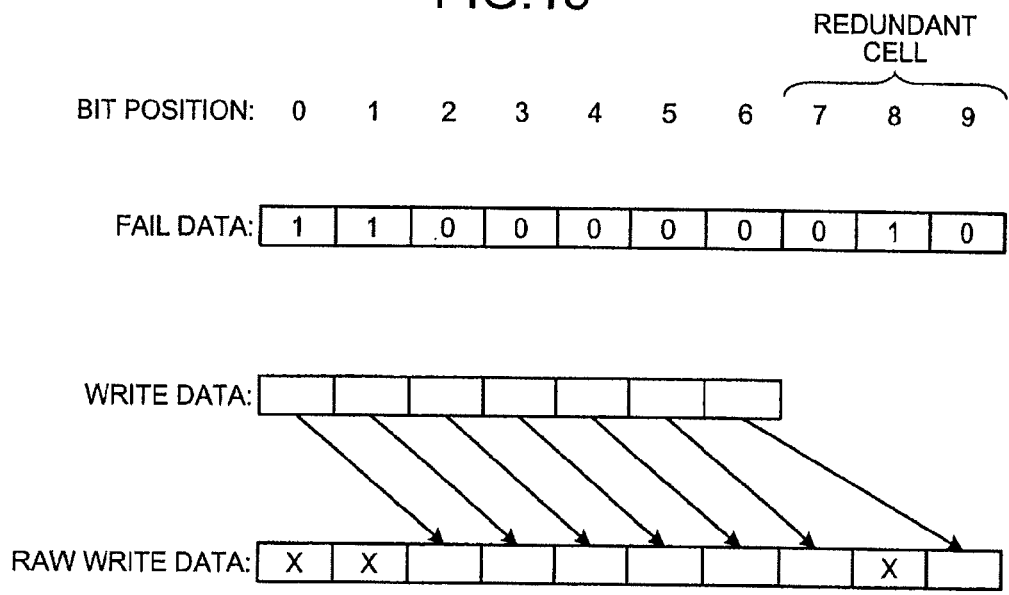
FIG. 13 is a schematic of the second example of the defective-bit replacement concerning write.

FIG. 13 is a schematic of the second example of the defective-bit replacement concerning write. In the shifted scheme, a redundant cell(s) is used in place of a defective cell(s), and cells other than the defective cell(s) are output in the order of bit position. In FIG. 13, for example, cells at bit positions where FAIL DATA of the specified word is 1 are defective. For example, FAIL DATA indicate that cells at bit positions 0, 1, and 8 are defective.

When the specified word is written, the semiconductor memory 100 writes data at the 0th bit of WRITE DATA into the data cell at the 2nd bit, while writes data at the 1st bit of WRITE DATA into the data cell at the 3rd bit. The semiconductor memory 100 writes data at the 2nd bit of WRITE DATA into the data cell at the 4th bit, while writes data at the 3rd bit of WRITE DATA into the data cell at the 5th bit.

The semiconductor memory 100 writes data at the 4th bit of WRITE DATA into the data cell at the 6th bit, while writes data at the 5th bit of WRITE DATA into the redundant cell at the 7th bit. The semiconductor memory 100 writes data at the 6th bit of WRITE DATA into the redundant cell at the 9th bit.

FIG. 14 is a first schematic of an example of HDL description of the read circuit 200 according to the second example. Here, there are redundant cells of 3 bits and data cells of 7 bits. For example, RD[0] is any one of data of RRD[0] to RRD[3]; RD[1] is any one of data of RRD[1] to RRD[4]; RD[2] is any one of data of RRD[2] to RRD[5]; RD[3] is any one of data of RRD[3] to RRD[6]; RD[4] is any one of data of RRD[4] to RRD[7]; RD[5] is any one of data of RRD[5] to RRD[8]; and RD[6] is any one of data of RRD[6] to RRD[9].

s1 to s6 are the same as s0 to s6 depicted in FIG. 6. RD[0] is described first. b0 is 0 if FD[0] is 0; 1 if FD[0] is not 0 and FD[1] is 0; 2 if FD[0] is not 0, FD[1] is not 0, and FD[2] is 0; 3 if FD[0] is not 0, FD[1] is not 0, and FD[2] is not 0. Thus, 0≤b0≤3.

RD[0] is any one of data of RRD[0] to RRD[3] according to b0. For example, RD[0] is the value of RRD[0] if b0 is 0; the value of RRD[1] if b0 is 1; the value of RRD[2] if b0 is 2; and the value of RRD[3] if b0 is 3. In other words, RD[0] is RRD[b0].

RD[1] is described next. If s0 is 0, b1 is 1 if FD[1] is 0; 2 if FD[1] is not 0 and FD[2] is 0; 3 if FD[1] is not 0, FD[2] is not 0, and FD[3] is 0; and 4 if FD[1] is not 0, FD[2] is not 0, FD[3] is not 0. Thus, 1≤b1≤4.

If s0 is not 0 (if s0 is 1), b1 is 2 if FD[2] is 0; 3 if FD[2] is not 0 and FD[3] is 0; and 4 if FD[2] is not 0 and FD[3] is not 0. Thus, 2≤b1≤4.

RD[1] is any one of data of RRD[1] to RRD[4] according to b1. For example, RD[1] is the value of RRD[1] if b1 is 1 (b1−1=0); the value of RRD[2] if b0 is 2 (b1−1=1); the value of RRD[3] if b0 is 3 (b1−1=2); and the value of RRD[4] if b0 is 4 (b1−1=3). In other words, RD[1] is RRD[b1].

FIG. 15 is a second schematic of the example of HDL description of the read circuit 200 according to the second example. RD[2] is described next. If s1 is 0, b2 is 2 if FD[2] is 0; 3 if FD[2] is not 0 and FD[3] is 0; 4 if FD[2] is not 0, FD[3] is not 0, and FD[4] is 0; and 5 if FD[2] is not 0, FD[3] is not 0, and FD[4] is not 0. Thus, 2≤b2≤5.

If s1 is 1, b2 is 3 if FD[3] is 0; 4 if FD[3] is not 0 and FD[4] is 0; and 5 if FD[3] is not 0 and FD[4] is not 0. Thus, 3≤b2≤5.

If s1 is neither 0 nor 1 (if s1 is 2), b2 is 4 if FD[4] is 0, while 5 if FD[4] is not 0. Thus, 4≤b2≤5.

RD[2] is any one of data of RRD[2] to RRD[5] according to b2−2. For example, RD[2] is RRD[2] if b2 is 2 (b2−2=0); RRD[3] if b2 is 3 (b2−2=1); RRD[4] if b2 is 4 (b2−2=2); and RRD[5] if b2 is 5 (b2−2=3). In other words, RD[2] is RRD[b2].

RD[3] is described next. If s2 is 0, b3 is 3 if FD[3] is 0; 4 if FD[3] is not 0 and FD[4] is 0; 5 if FD[3] is not 0, FD[4] is not 0, and FD[5] is 0; and 6 if FD[3] is not 0, FD[4] is not 0, and FD[5] is not 0. Thus, 3≤b3≤6.

If s2 is 1, b3 is 4 if FD[4] is 0; 5 if FD[4] is not 0 and FD[5] is 0; and 6 if FD[4] is not 0 and FD[5] is not 0. Thus, 4≤b3≤6.

If s2 is 2, b3 is 5 if FD[5] is 0, while 6 if FD[5] is not 0. If s2 is none of 0 to 2 (if s2 is 3), b3 is 6.

RD[3] is any one of data of RRD[3] to RRD[6] according to b2−3. For example, RD[3] is RRD[3] if b3 is 3 (b3−3=0); RRD[4] if b3 is 4 (b3−3=1); RRD[5] if b3 is 5 (b3−3=2); and RRD[6] if b3 is 6 (b3−3=3). In other words, RD[3] is RRD[b3]. Detailed description of RD[4] and RD[5] is omitted.

FIG. 16 is a third schematic of the example of HDL description of the read circuit 200 according to the second example. RD[6] is described next. If s5 is 0, b6 is 6 if FD[6] is 0; 7 if FD[6] is not 0 and FD[7] is 0; 8 if FD[6] is not 0, FD[7] is not 0, and FD[8] is 0; 9 if FD[6] is not 0, FD[7] is not 0, and FD[8] is not 0. Thus, 6≤b6≤9.

If s5 is 1, b6 is 7 if FD[7] is 0; 8 if FD[7] is not 0 and FD[8] is 0; and 9 if FD[7] is not 0 and FD[8] is not 0. Thus, 7≤b6≤9.

If s5 is 2, b6 is 8 if FD[8] is 0, while 9 if FD[8] is not 0. If s5 is none of 0 to 2 (if s5 is 3), b6 is 9.

RD[6] is any one of data of RRD[6] to RRD[9] according to b6−6. For example, RD[6] is RRD[6] if b6 is 6 (b6−6=0); RRD[7] if b6 is 7 (b6−6=1); RRD[8] if b6 is 8 (b6−6=2); and RRD[9] if b6 is 9 (b6−6=3). In other words, RD[6] is RRD[b6].

FIG. 17 is a schematic of an example of generalized RDs depicted in FIGS. 14 to 16. In FIG. 17, RD[1] to RD[6] are represented by RD[i] (i=1 to 6). s0 to s6 are represented by s[0] to s[6]. RD[0] can be also represented in a similar manner to other RDs depicted in FIG. 17 by assuming s[−1]=0.

Figures 18, 19:
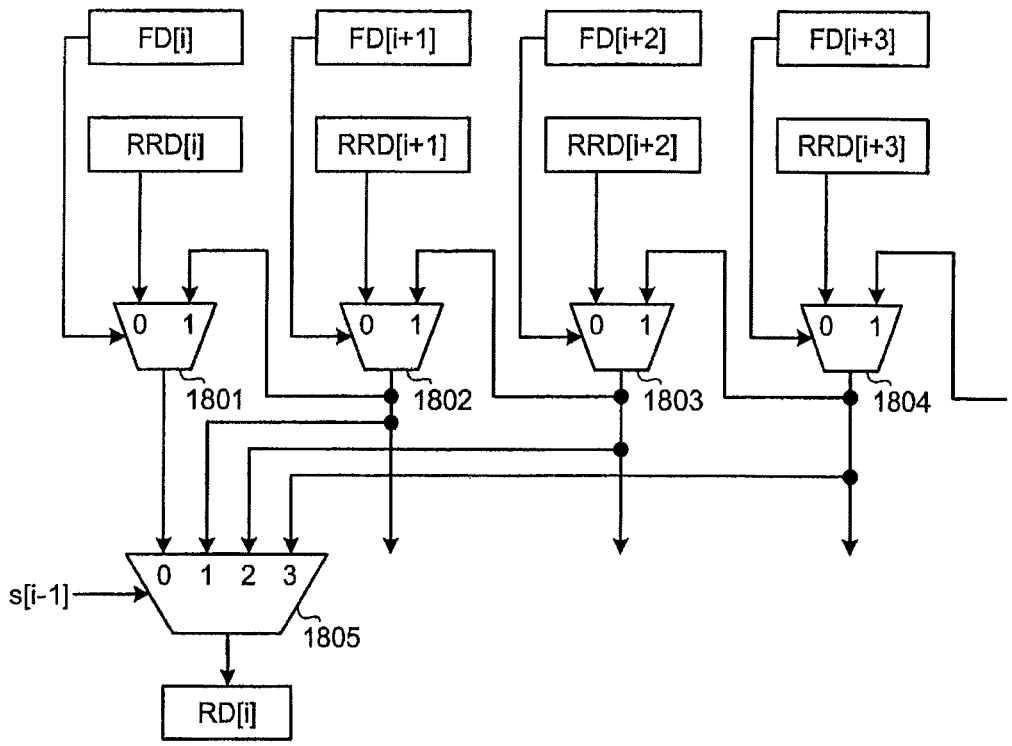
FIG. 18 is a schematic of an example of the read circuit 200 according to the second example.
FIG. 19 is a schematic of an example of HDL description of the write circuit 300 according to the second example.

FIG. 18 is a schematic of an example of the read circuit 200 according to the second example. An example of RD[i] is depicted in FIG. 18. The selection circuit 1801 outputs RRD[i] if FD[i] is 0, while outputs the output of the selection circuit 1802 concerning i+1 if FD[i] is 1. The selection circuit 1802 outputs RRD[i+1] if FD[i+1] is 0, while outputs the output of the selection circuit 1803 concerning i+2 if FD[i+1] is 1.

The selection circuit 1803 outputs RRD[i+2] if FD[i+2] is 0, while outputs the output of the selection circuit 1804 concerning i+3 if FD[i+2] is 1. The selection circuit 1804 outputs RRD[i+3] if FD[i+3] is 0, while outputs the output of the selection circuit concerning i+4 if FD[i+3] is 1.

The selection circuit 1805 outputs the output of the selection circuit 1801 as RD[i] if s[i−1] is 0; the output of the selection circuit 1802 as RD[i] if s[i−1] is 1; the output of the selection circuit 1803 as RD[i] if s[i−1] is 2; and the output of the selection circuit 1804 as RD[i] if s[i−1] is 3.

An example is described where FD[0] to FD[9] and RRD[0] to RRD[9] are as follows.

FD[0]=1
FD[1]=1
FD[2]=0
FD[3]=0
FD[4]=0
FD[5]=0
FD[6]=0
FD[7]=0
FD[8]=1
FD[9]=0
RRD[0]=x
RRD[1]=x
RRD[2]=0
RRD[3]=0
RRD[4]=1
RRD[5]=0
RRD[6]=0
RRD[7]=0
RRD[8]=x
RRD[9]=1

This indicates that the data cell at the 0th bit, the data cell at the 1st bit, and the redundant cell at the 8th bit are defective. s0 to s6 are described below.
s0=FD[0]=1
s1=FD[1]+s0=1+1=2
s2=FD[2]+s1=0+2=2
s3=FD[3]+s2=0+2=2
s4=FD[4]+s3=0+2=2
s5=FD[5]+s4=0+2=2
s6=FD[6]+s5=0+2=2
b0 to b6 are described below.
b0=2
b1=3
b2=4
b3=5
b4=6
b5=7
b6=9
RD[0] to RD[6] are as follows.
RD[0]=RRD[2]=0
RD[1]=RRD[3]=0
RD[2]=RRD[4]=1
RD[3]=RRD[5]=0
RD[4]=RRD[6]=0
RD[5]=RRD[7]=0
RD[6]=RRD[9]=1

FIG. 19 is a schematic of an example of HDL description of the write circuit 300 according to the second example. s(−1) is 0. s0 to s6 are the same as s0 to s6 depicted in FIG. 6. s7 is s6 plus FD[7], while s8 is s7 plus FD[8].

RWD[9] is 0 if s8 is any one of 0 to 2, while WD[6] if s8 is 3. RWD[8] is 0 if s7 is 0 or 1; WD[6] if s7 is 2; and WD[5] if s7 is 3. RWD[7] is 0 if s6 is 0; WD[6] if s6 is 1; WD[5] if s6 is 2; and WD[4] if s6 is 3.

RWD[6] is WD[6] if s5 is 0; WD[5] if s5 is 1; WD[4] if s5 is 2; and WD[3] if s5 is 3. RWD[5] is WD[5] if s4 is 0; WD[4] if s4 is 1; WD[3] if s4 is 2; and WD[2] if s4 is 3.

RWD[4] is WD[4] if s3 is 0; WD[3] if s3 is 1; WD[2] if s3 is 2; and WD[1] if s3 is 3. RWD[3] is WD[3] if s2 is 0; WD[2] if s2 is 1; WD[1] if s2 is 2; and WD[0] if s2 is 3.

RWD[2] is WD[2] if s1 is 0; WD[1] if s1 is 1; and WD[0] if s1 is 2. RWD[1] is WD[1] if s0 is 0, while WD[0] if s0 is 1. RWD[0] is WD[0]. s0 cannot be 2 or 3 since 0≤S0≤1, and s1 cannot be 3 since 0≤s1≤2.

Figure 20:
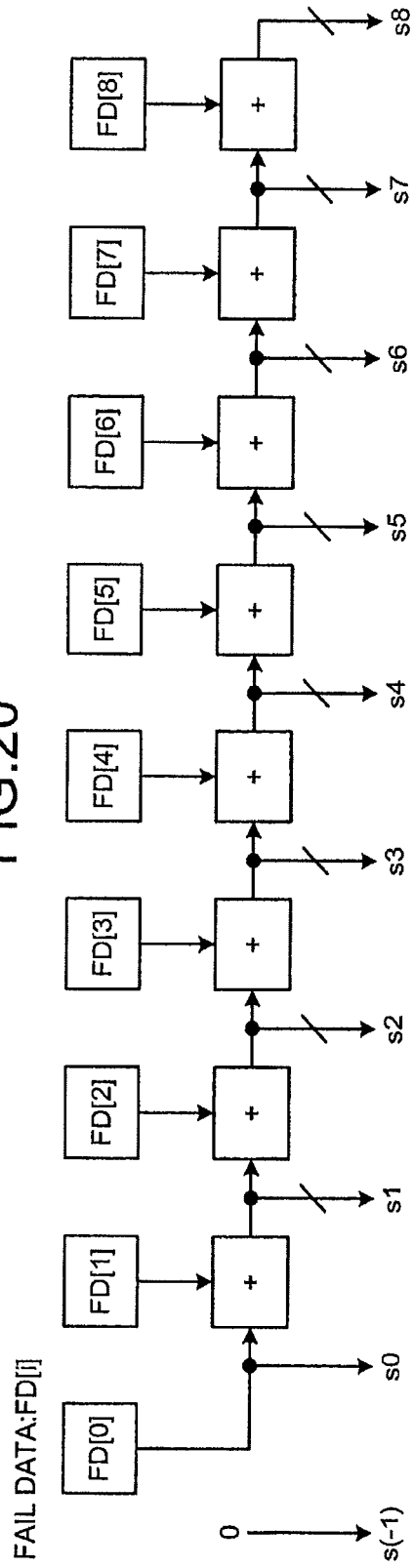
FIG. 20 is a first schematic of an example of the write circuit 300 according to the second example.

FIG. 20 is a first schematic of an example of the write circuit 300 according to the second example. s(−1) is 0. s0 to s6 are the same as s0 to s6 depicted in FIG. 6. s7 is s6 plus FD[7], while s8 is s7 plus FD[8].

Figure 21:
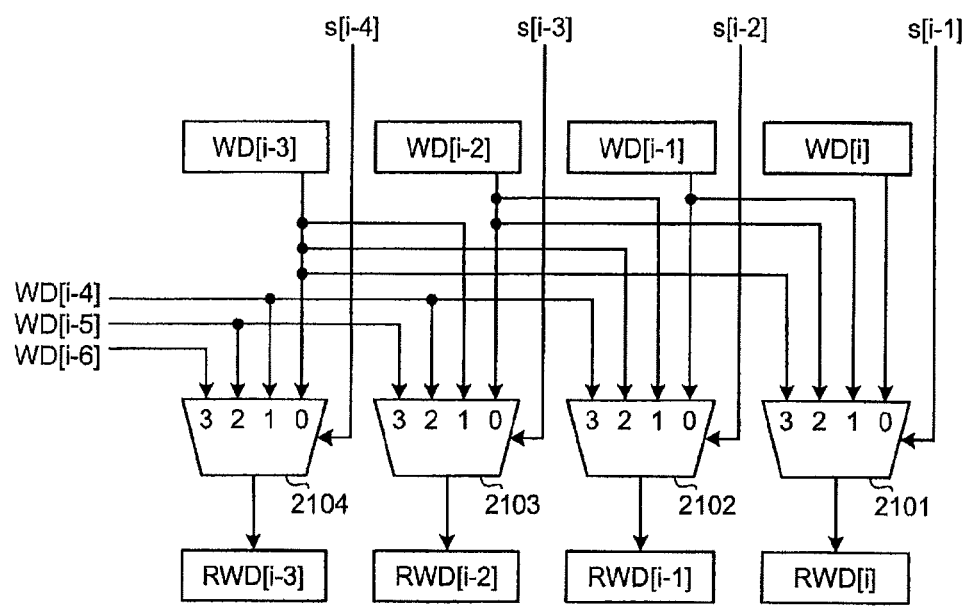
FIG. 21 is a second schematic of the example of the write circuit 300 according to the second example.

FIG. 21 is a second schematic of the example of the write circuit 300 according to the second example. s0 to s8 are represented by s[i] (i=0 to 9). The selection circuit 2101 outputs WD[i] as RWD[i] if s[i−1] is 0; WD[i−1] if s[i−1] is 1; WD[i−2] if s[i−1] is 2; and WD[i−3] if s[i−1] is 3.

The selection circuit 2102 outputs WD[i−1] as RWD[i−1] if s[i−2] is 0; WD[i−2] if s[i−2] is 1; WD[i−3] if s[i−2] is 2; and WD[i−4] if s[i−2] is 3.

The selection circuit 2103 outputs WD[i−2] as RWD[i−2] if s[i−3] is 0; WD[i−3] if s[i−3] is 1; WD[i−4] if s[i−3] is 2; and WD[i−5] if s[i−3] is 3.

The selection circuit 2104 outputs WD[i−3] as RWD[i−3] if s[i−4] is 0; WD[i−4] if s[i−4] is 1; WD[i−5] if s[i−4] is 2; and WD[i−6] if s[i−4] is 3.

An example is described where FD[0] to FD[9] and WD[0] to WD[6] are as follows.
FD[0]=1
FD[1]=1
FD[2]=0
FD[3]=0
FD[4]=0
FD[5]=0
FD[6]=0
FD[7]=0
FD[8]=1
FD[9]=0
WD[0]=1
WD[1]=1
WD[2]=0
WD[3]=0
WD[4]=1
WD[5]=0
WD[6]=1

This indicates that the data cell at the 0th bit, the data cell at the 1st bit, and the redundant cell at the 8th bit are defective. s0 to s8 are described below.
s0=FD[0]=1
s1=FD[1]+s0=1+1=2
s2=FD[2]+s1=0+2=2
s3=FD[3]+s2=0+2=2
s4=FD[4]+s3=0+2=2
s5=FD[5]+s4=0+2=2
s6=FD[6]+s5=0+2=2
s7=FD[7]+s6=0+2=2
s8=FD[8]+s7=1+2=3
RWD[9]=WD[6]=1
RWD[8]=WD[6]=1
RWD[7]=WD[5]=0
RWD[6]=WD[4]=1
RWD[5]=WD[3]=0
RWD[4]=WD[2]=0
RWD[3]=WD[1]=1
RWD[2]=WD[0]=1
RWD[1]=WD[0]=1
RWD[0]=WD[0]=1

In a second embodiment, a coding of defective-cell position data different from that of the first embodiment is described. Three coding technologies are taken as an example. In the first example (hereinafter, "coding technology 1"), the defective-cell position data are a bit string of x+y bits (a bit width of data cells and redundant cells) indicating whether the cells are defective as described in the first embodiment. In the second example (hereinafter, "coding technology 2"), the defective-cell position data are data indicating what number bit(s) is a defective cell(s). In the third example (hereinafter, "coding technology 3"), the defective-cell position data are a combination number indicating the combination of cells that are defective (defective cells) among the data cells and the redundant cells. Each combination of cells to be replaced with redundant cells is assigned with a number that is the combination number.

It is assumed that, among data cells of lower 7 bits and redundant cells of higher 3 bits, the data cell at the 0th bit, the data cell at the 3rd bit, and the redundant cell at the 7th bit are defective bits. In this case, the defective-cell position data according to the coding technologies 1 to 3 are as follows.
Coding technology 1: 1001000100 (The left-most bit is the least significant bit, while the right-most bit is the most significant bit.)
Coding technology 2: 0000 0011 0111 (4 bits on the left indicate that the data cell at the 0th bit is a defective cell; 4 bits at the center indicate that the data cell at the 3rd bit is a defective cell; and 4 bits on the right indicate that the data cell at the 7th bit is a defective cell.)
Coding technology 3: 0010010 (C(n,r) (=nCr) where n=10 and r=3 is taken as an example.)

To store the defective-cell position data in data cells of 7 bits and redundant cells of 3 bits, the position-data storage unit 103 requires for each word: cells of 10 bits in the coding technology 1; cells of 12 bits in the coding technology 2; and cells of 7 bits in the coding technology 3.

If the defective-cell position data coded according to the coding technology 2 or 3 are stored in the position-data storage unit 103, the defective-cell position data are converted into those coded according to the coding technology 1 to prevent any change in the first and/or the second examples of the defective-bit replacement circuit 104. Alternatively, the defective-cell position data coded according to the coding technology 2 or 3 may input into the defective-bit replacement circuit 104; however, detailed description is omitted.

Figure 22:
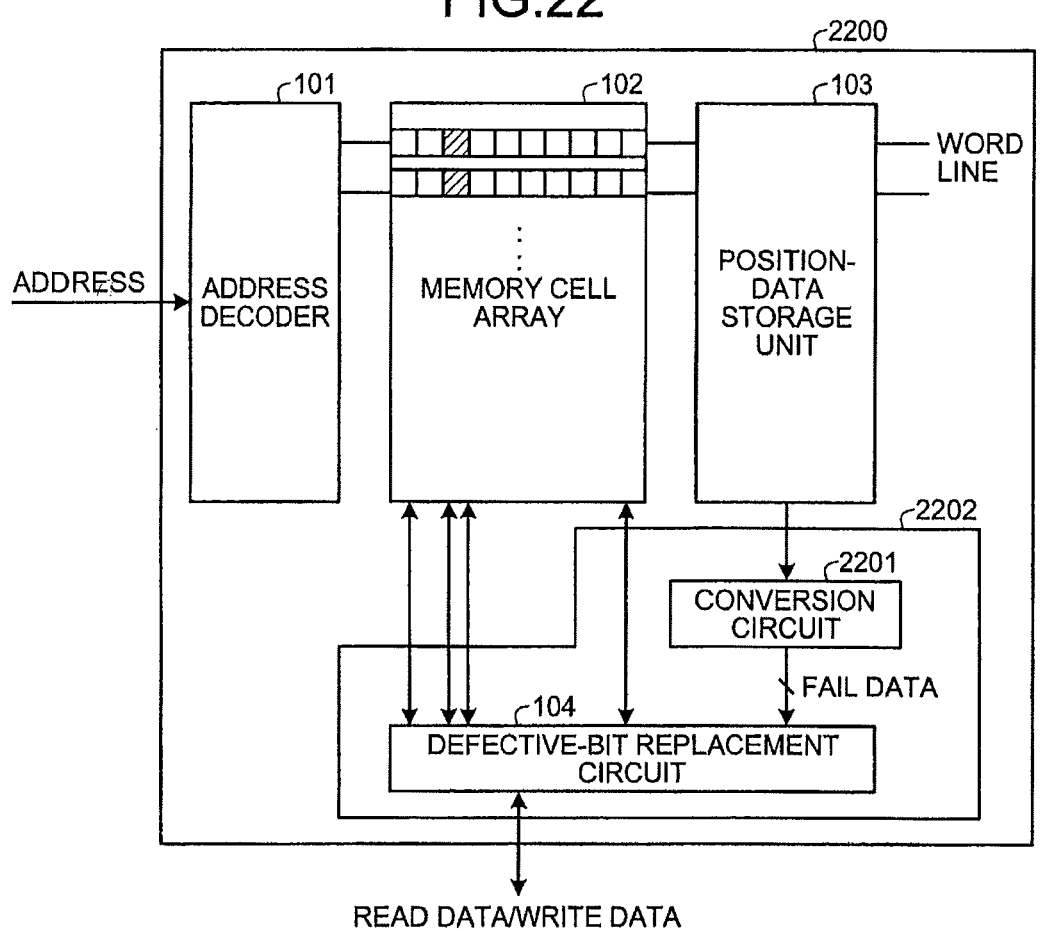
FIG. 22 is a schematic of a semiconductor memory according to a second embodiment.

FIG. 22 is a schematic of a semiconductor memory according to the second embodiment. A semiconductor memory 2200 includes the address decoder 101, the memory cell array 102, the position-data storage unit 103, the defective-bit replacement circuit 104, and a conversion circuit 2201. For example, the conversion circuit 2201 converts the defective-cell position data coded according to the coding technology 2 or 3 to those coded according to the coding technology 1.

Figure 23:
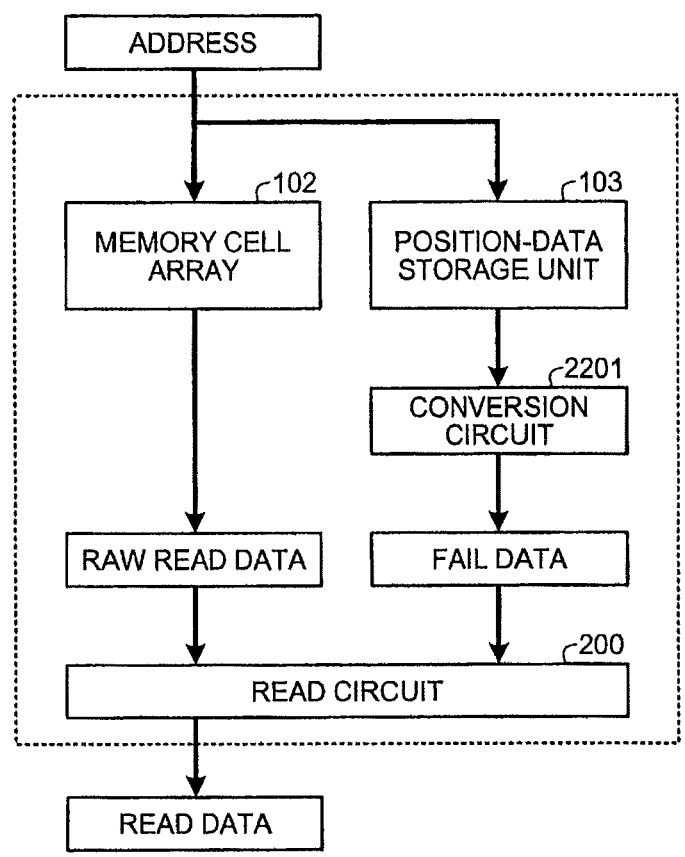
FIG. 23 is a schematic of an example of read performed by the defective-bit replacement circuit 104 according to the second embodiment.
Figure 24:
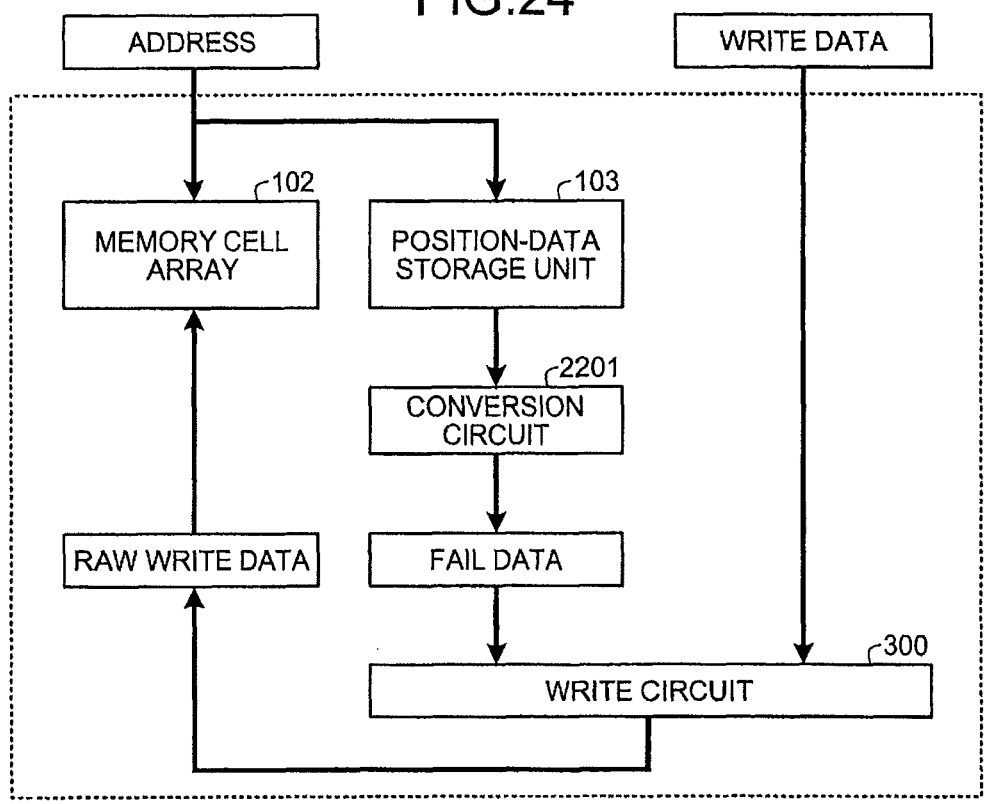
FIG. 24 is a schematic of an example of write performed by the defective-bit replacement circuit 104 according to the second embodiment.

In FIG. 22, the conversion circuit 2201 and the defective-bit replacement circuit 104 are different circuits. Alternatively, the conversion circuit 2201 and the defective-bit replacement circuit 104 may be combined into a single circuit 2202 by logic synthesis. The conversion circuit 2201 and the read circuit 200 may be combined into a single circuit by logic synthesis, or the conversion circuit 2201 and the write circuit 300 may be combined into a single circuit by logic synthesis. In FIGS. 23 and 24, an example is described in which the defective-cell position data coded according to the coding technology 1 or 2 are converted into those coded according to the coding technology 3 during read and write.

FIG. 23 is a schematic of an example of read performed by the defective-bit replacement circuit 104 according to the second embodiment. Data of the specified word specified by ADDRESS included in a read command are output from the memory cell array 102 and the position-data storage unit 103. The memory cell array 102 outputs RAW READ DATA as the data of the specified word. Here, it is assumed that the memory cell array 102 includes data cells of 7 bits and redundant cells of 3 bits. Thus, RAW READ DATA are data of 10 bits. The position-data storage unit 103 outputs the defective-cell position data of the specified word, and the conversion circuit 2201 converts the defective-cell position data into a bit string of x+y bits indicating whether the cells are defective. The result of the conversion is FAIL DATA.

The read circuit 200 of the defective-bit replacement circuit 104 outputs READ DATA of 7 bits obtained by removing defective bits from RAW READ DATA of 10 bits based on FAIL DATA output from the position-data storage unit 103.

FIG. 24 is a schematic of an example of write performed by the defective-bit replacement circuit 104 according to the second embodiment. The position-data storage unit 103 outputs defective-cell position data of the specified word specified by ADDRESS included in a write command. The conversion circuit 2201 converts the defective-cell position data into the bit string of x+y bits indicating whether the cells are defective (the defective-cell position data coded according to the coding technology 1). The result of the conversion is FAIL DATA. WRITE DATA are write data of 7 bits. The write circuit 300 of the defective-bit replacement circuit 104 replaces WRITE DATA with RAW WRITE DATA based on FAIL DATA, and writes into cells of the specified word in the memory cell array 102.

FIG. 25 is a schematic of bit widths of defective-cell position data for each word according to the coding technologies. A table 2500 indicates bit widths of 1 word required for the position-data storage unit 103 to store the defective-cell position data according to the coding technologies for different bit widths of data cells and redundant cells in the memory cell array 102.

The table 2500 includes columns of memory cell array, coding technology 1, coding technology 2, and coding technology 3. The memory cell array includes columns of x, y, and bit width of 1 word. x indicates the bit width of data cells, while y indicates the bit width of redundant cells. The coding technologies 1, 2, and 3 respectively include columns of bit width of 1 word and overhead. The bit width of 1 word indicates the bit width of the defective-cell position data for each word required for the coding technologies. The overhead (unit: %) is the bit width of 1 word in the position-data storage unit 103/memory cell array 102. The coding technology 3 further includes a column of the number of combinations.

A case where x is 7, y is 3, and the bit width of 1 word is 10 in the column of memory array is taken as an example. In the coding technology 1, 1 word of the position-data storage unit 103 requires 10 bits, and the overhead is 100%. In the coding technology 2, 1 word of the position-data storage unit 103 requires 12 bits, and the overhead is 120%. In the coding technology 3, the number of combinations is 120, 1 word of the position-data storage unit 103 requires 7 bits, and the overhead is 70%. When x (bit width of data cell) is 7 and y (bit width of redundant cell) is 3, among the coding technologies 1 to 3, the amount of the defective-cell position data stored in the position-data storage unit 103 is the least in the coding technology 3, the second least in the coding technology 1, and the most in the coding technology 2.

A case where x is 32, y is 4, and the bit width of 1 word is 36 in the column of memory array is taken as an example. In the coding technology 1, 1 word of the position-data storage unit 103 requires 36 bits, and the overhead is 100%. In the coding technology 2, 1 word of the position-data storage unit 103 requires 24 bits, and the overhead is 67%. In the coding technology 3, the number of combinations is 58905, 1 word of the position-data storage unit 103 requires 16 bits, and the overhead is 44%. When x (bit width of data cell) is 32 and y (bit width of redundant cell) is 4, among the coding technologies 1 to 3, the amount of the defective-cell position data stored in the position-data storage unit 103 is the least in the coding technology 3, the second least in the coding technology 2, and the most in the coding technology 1.

Details of an exemplary circuit for the conversion from the defective-cell position data coded according to the coding technology 2 or 3 to those coded according to the coding technology 1 are described next.

Figure 26:
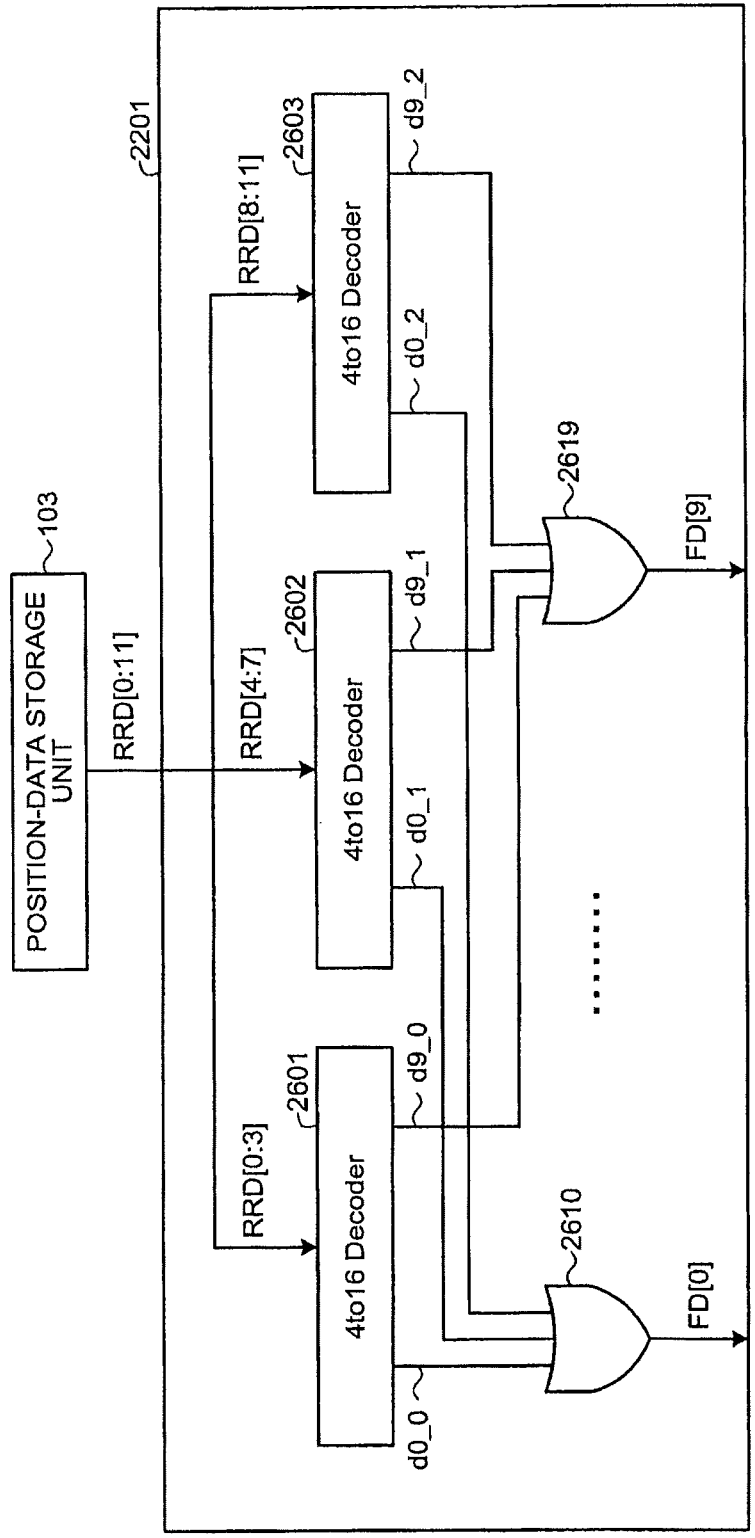
FIG. 26 is a schematic of an example of a conversion circuit 2201 according to coding technology 2.

FIG. 26 is a schematic of an example of the conversion circuit 2201 according to the coding technology 2. The conversion circuit 2201 includes 4to16 decoders 2601, 2602, and 2603, and OR circuits 2610 to 2619. In FIG. 26, OR circuits concerning FD[1] to FD[8] are omitted. RRD[0:11] represents the defective-cell position data having 12 bits and concerning the specified word that are output from the position-data storage unit 103 and coded according to the coding technology 2.

The 4to16 decoder 2601 decodes RRD[0:3] of RRD[0:11], and outputs decoded data of 16 bits. For example, RRD[0:3]=4'b0001 indicates that the data cell at the 1st bit of the specified word in the memory cell array 102 is defective. The 4to16 decoder 2601 outputs the decoded data of 16 bits (d0_0 to d15_0) with its 1st bit (d0_0) being 1 and other 15 bits being 0. Since the value of RRD[0:3] is 0 to 9, the higher 6 bits (d10_0 to d15_0) of the decoded data of 16 bits (d0_0 to d15_0) are not necessary.

The 4to16 decoder 2602 decodes RRD[4:7] of RRD[0:11], and outputs decoded data of 16 bits. For example, RRD[4:7] =4'b0010 indicates that the data cell at the 2nd bit of the specified word in the memory cell array 102 is defective. The 4to16 decoder 2602 outputs the decoded data of 16 bits (d0_1 to d15_1) with its 2nd bit (d2_1) being 1 and other 15 bits being 0. Since the value of RRD[4:7] is 0 to 9, the higher 6 bits (d10_1 to d15_1) of the decoded data of 16 bits (d0_1 to d15_1) are not necessary.

The 4to16 decoder 2603 decodes RRD[8:11] of RRD[0:11], and outputs decoded data of 16 bits. For example, RRD[8:11]=4'b0010 indicates that the data cell at the 2nd bit of the specified word in the memory cell array 102 is defective. The 4to16 decoder 2603 outputs the decoded data of 16 bits (d0_1 to d15_1) with its 2nd bit (d2_1) being 1 and other 15 bits being 0. Since the value of RRD[8:11] is 0 to 9, the higher 6 bits (d10_1 to d15_1) of the decoded data of 16 bits (d0_1 to d15_1) are not necessary.

The OR circuit 2610 outputs 1 as the value of FD[0] if at least one of d0_0, d0_1, and d0_2 is 1. The OR circuit 2619 outputs 1 as the value of FD[9] if at least one of d9_0, d9_1, and d9_2 is 1. OR circuits concerning FD[1] to FD[8] operates similarly to the OR circuits 2610 and 2619. Details of the coding technology 3 are described next.

FIG. 27 is a schematic of an example of combination numbers of defective cell according to the coding technology 3. The memory cell array 102 that includes data cells of 7 bits and redundant cells of 3 bits for each word is taken as an example. The number of combinations where 3 cells are defective among cells of 10 bits is C(10,3), that is, 120. The bit position indicates the order of bit in 1 word of the memory cell array 102, and "x" indicates a defective cell. The code data are defective-cell position data coded according to the coding technology 3. For example, if "x" appears at the bit positions 1, 3, and 5, the defective-cell position data coded according to the coding technology 3 is 44.

For easy understanding, cells of 3 bits are always replaced in this example; however, there can be various types of variations. For example, the number of combinations is 1+10+45+120=176, where 1 is the number of combinations when all cells of 10 bits are normal; 10 is C(10,1) when a cell of 1 bit among 10 bits is a defective cell; 45 is C(10,2) when cells of 2 bits among 10 bits are defective cell s; and 120 is C(10,3) when cells of 3 bits among 10 bits are defective cell s.

Figure 28:
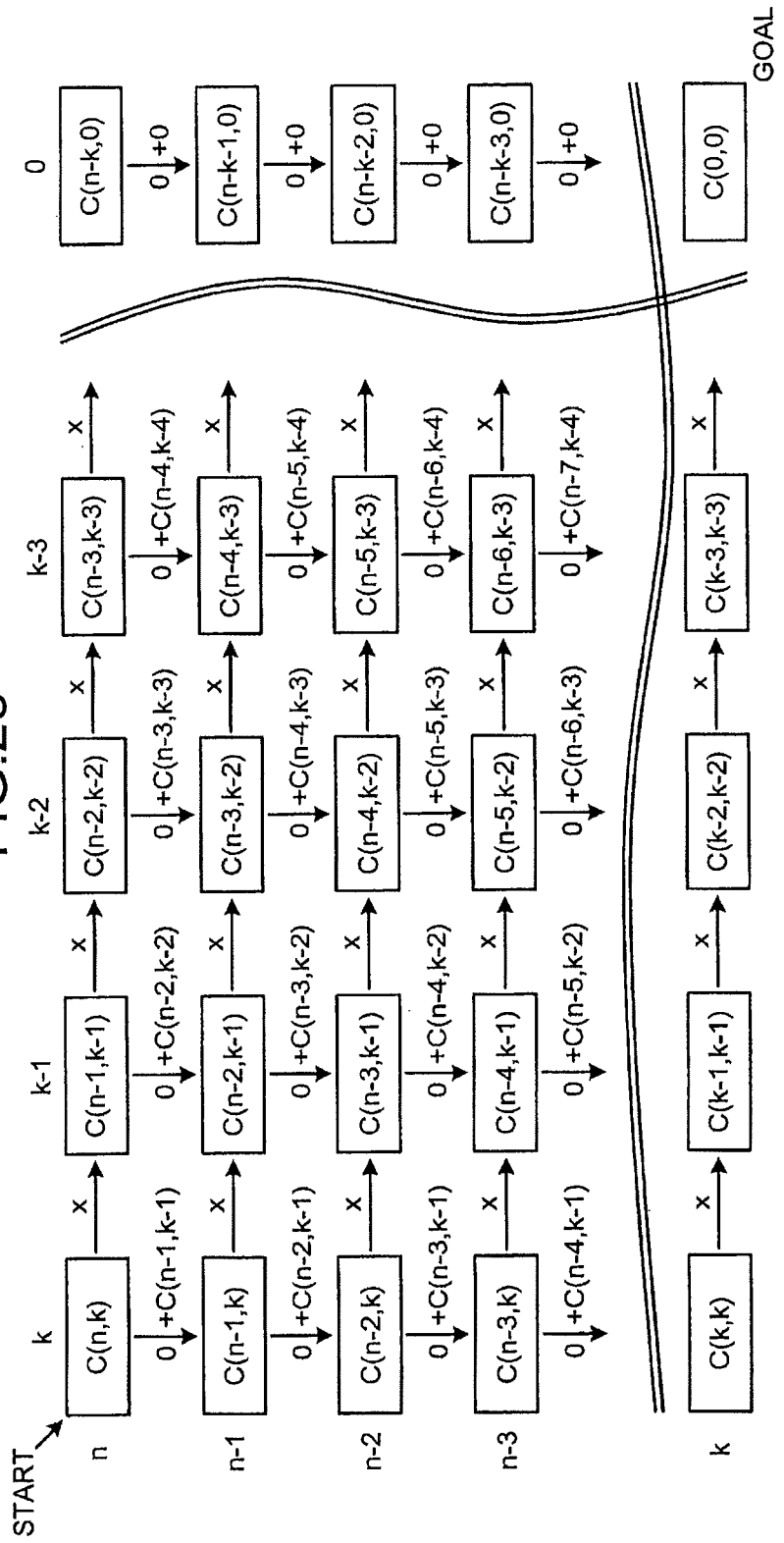
FIG. 28 is a first schematic of an example of coding according to the coding technology 3.

FIG. 28 is a first schematic of an example of a coding according to the coding technology 3. In FIG. 28, an example is described in which the defective-cell position data are calculated by automaton. It is assumed that the bit width of 1 word of the memory cell array 102 is n, while the bit width of redundant cell is k. The number of combinations for selecting k from among n is C(n,r). In FIG. 28, (k+1) nodes are arranged horizontally while (n+1−k) nodes are arranged vertically to form a lattice. The weight of the rightward branch is 0, while the weight of the downward branch is C(p,q). The rightward branch accepts "x," while the downward branch accepts 0.

To enumerate all combinations obtained by arranging k "x" and n "0" (xxx0000000 to 0000000xxx) is equivalent to enumerate all paths from the upper-left "START" to the lower-right "GOAL" depicted in FIG. 28.

Figure 29:
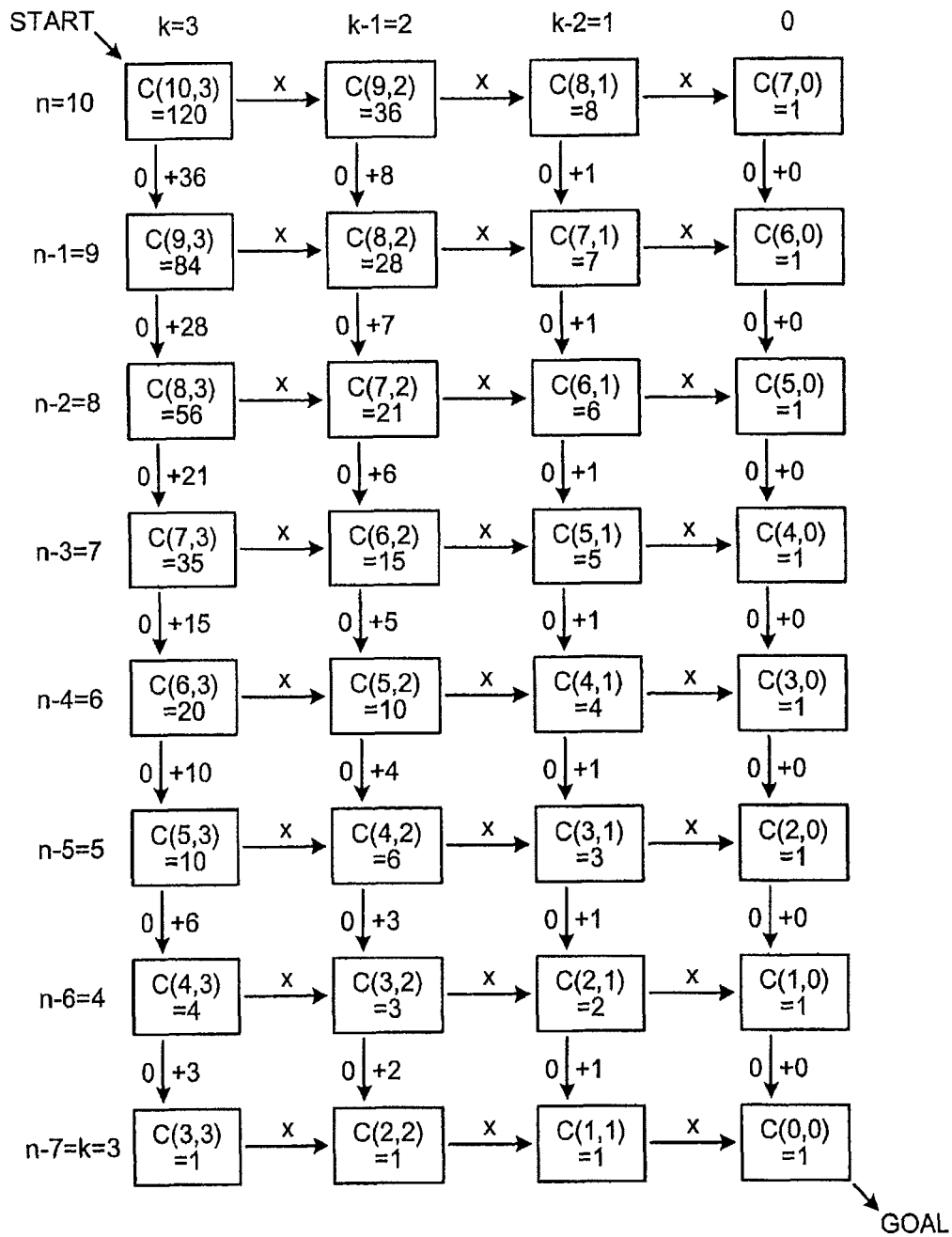
FIG. 29 is a second schematic of the example of the coding according to the coding technology 3.

FIG. 29 is a second schematic of the example of the coding according to the coding technology 3. An example of C(10,3) is depicted in FIG. 29, and (k+1)=4 nodes horizontally arranged and (n+1−k)=8 nodes vertically arranged form the total number of 32 nodes. The enumeration starts from C(10, 3), and proceeds downward or rightward to C(0,0).

Figure 30:
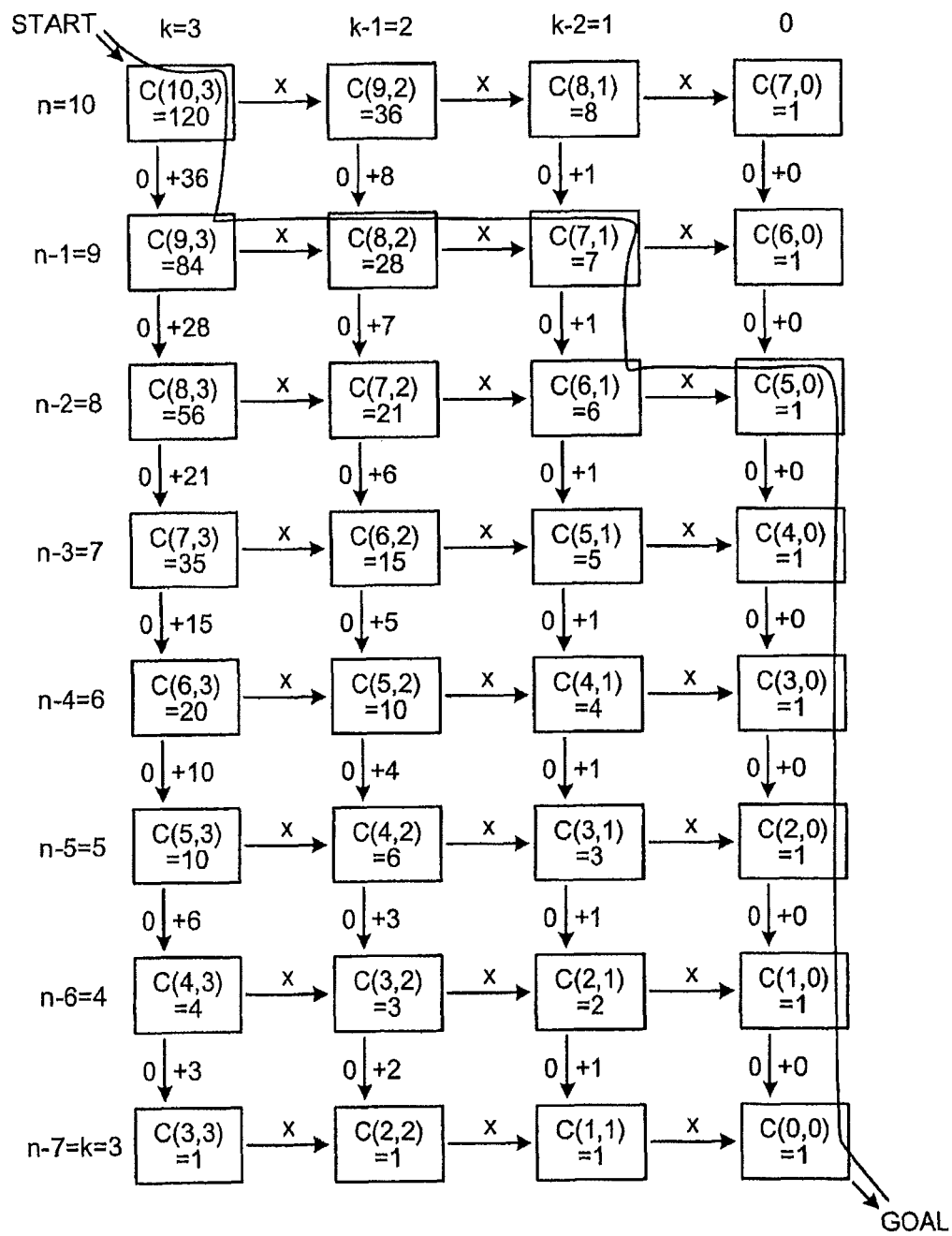
FIG. 30 is a third schematic of the example of the coding according to the coding technology 3.

FIG. 30 is a third schematic of the example of the coding according to the coding technology 3. It is assumed that the data indicating whether the cells of the specified word are defective bits are "0xx0x00000." This indicates that cells at the 1st bit, the 2nd bit, and the 4th bit are defective cell s. Z represents the defective-cell position data coded according to the coding technology 3, and the current node position is C(10,3). The current node position transits from the node C(10,3) to the node C(9,3) since the 0th bit of "0xx0x00000" is 0, where Z=+36.

The current node position transits from the node C(9,3) to the node C(8,2) since the 1st bit of "0xx0x00000" is x, where Z=36+0. The current node transits from the node C(8,2) to the node C(7,1) since the 2nd bit of "0xx0x00000" is x, where Z=36+0.

The current node position transits from the node C(7,1) to the node C(6,1) since the 3rd bit of "0xx0x00000" is 0, where Z=36+1. The current node position transits from the node C(6,1) to the node C(5,0) since the 4th bit of "0xx0x00000" is x, where Z=37+0. The current node position transits from the node C(5,0) to the node C(4,0) since the 5th bit of "0xx0x00000" is 0, where Z=37+0.

The current node position transits from the node C(4,0) to the node C(3,0) since the 6th bit of "0xx0x00000" is 0, where Z=37+0. The current node position transits from the node C(3,0) to the node C(2,0) since the 7th bit of "0xx0x00000" is 0, where Z=37+0. The current node position transits from the node C(2,0) to the node C(4,0) since the 8th bit of "0xx0x00000" is 0, where Z=37+0.

The current node position transits from the node C(1,0) to the node C(0,0) since the 9th bit of "0xx0x00000" is 0, where Z=37+0. The process ends since the current node position has reached C(0,0). Thus, the defective-cell position data is 37 (100101 in binary). 37 is stored in the specified word of the position-data storage unit 103. A conversion from the defective-cell position data coded according to the coding technology 3 to those coded according to the coding technology 1 is described next.

Figure 31:
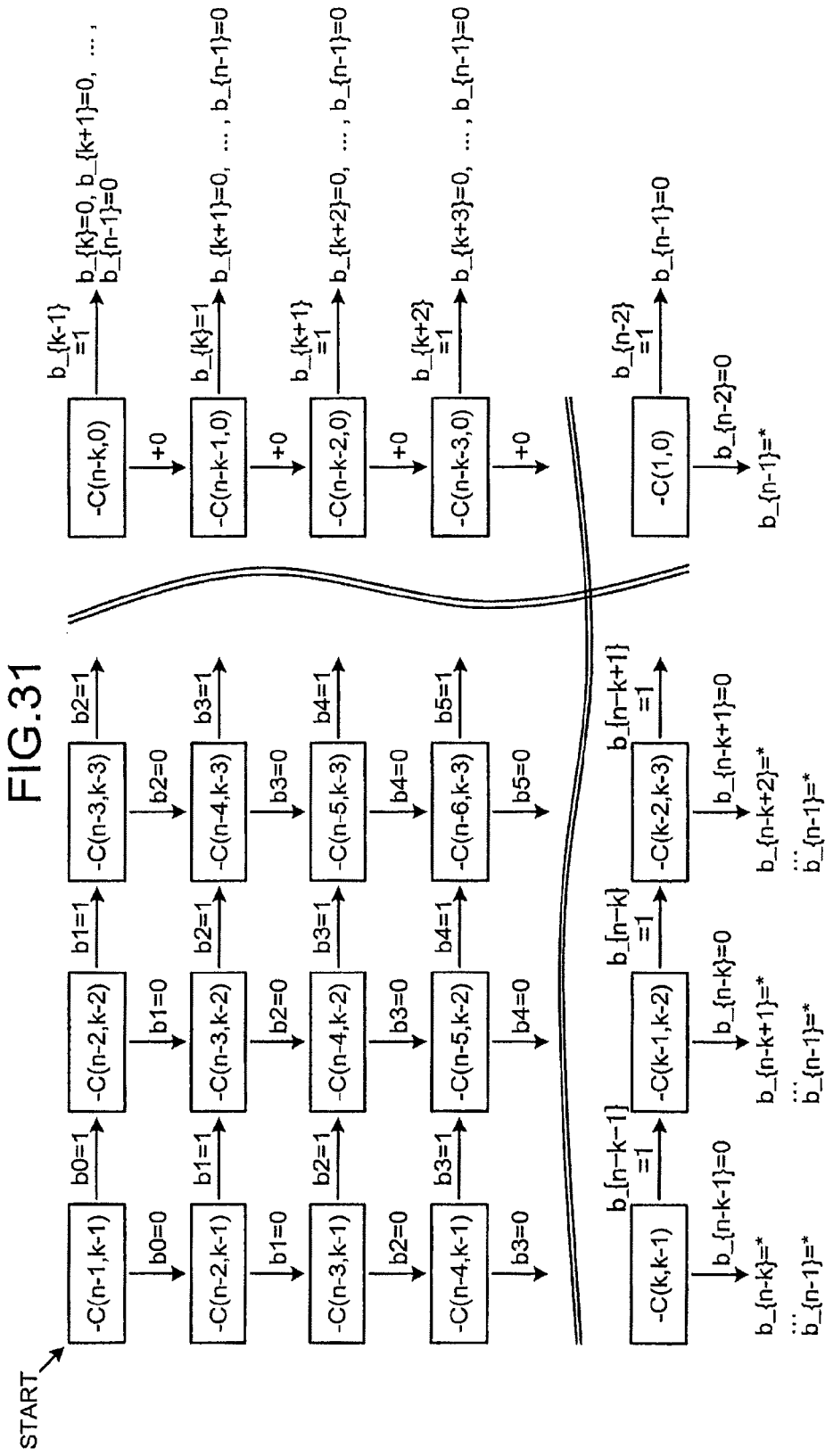
FIG. 31 is a schematic of an example of the conversion circuit 2201 concerning the coding technology 3.

FIG. 31 is a schematic of an example of the conversion circuit 2201 concerning the coding technology 3. For example, the conversion circuit 2201 converts 37 that is the defective-cell position data coded according to the coding technology 3 depicted in FIG. 30 into 0110100000 that is the defective-cell position data coded according to the coding technology 1. In FIG. 31, b0=1 and b1=0 between nodes represent conversion data, and b0 to b{n−1} are obtained by the conversion circuit 2201 as the result of conversion. An example of converting the defective-cell position data coded based on C(n,k) is depicted in FIG. 31. The conversion circuit 2201 includes multiple arithmetic circuits.

Figure 32:
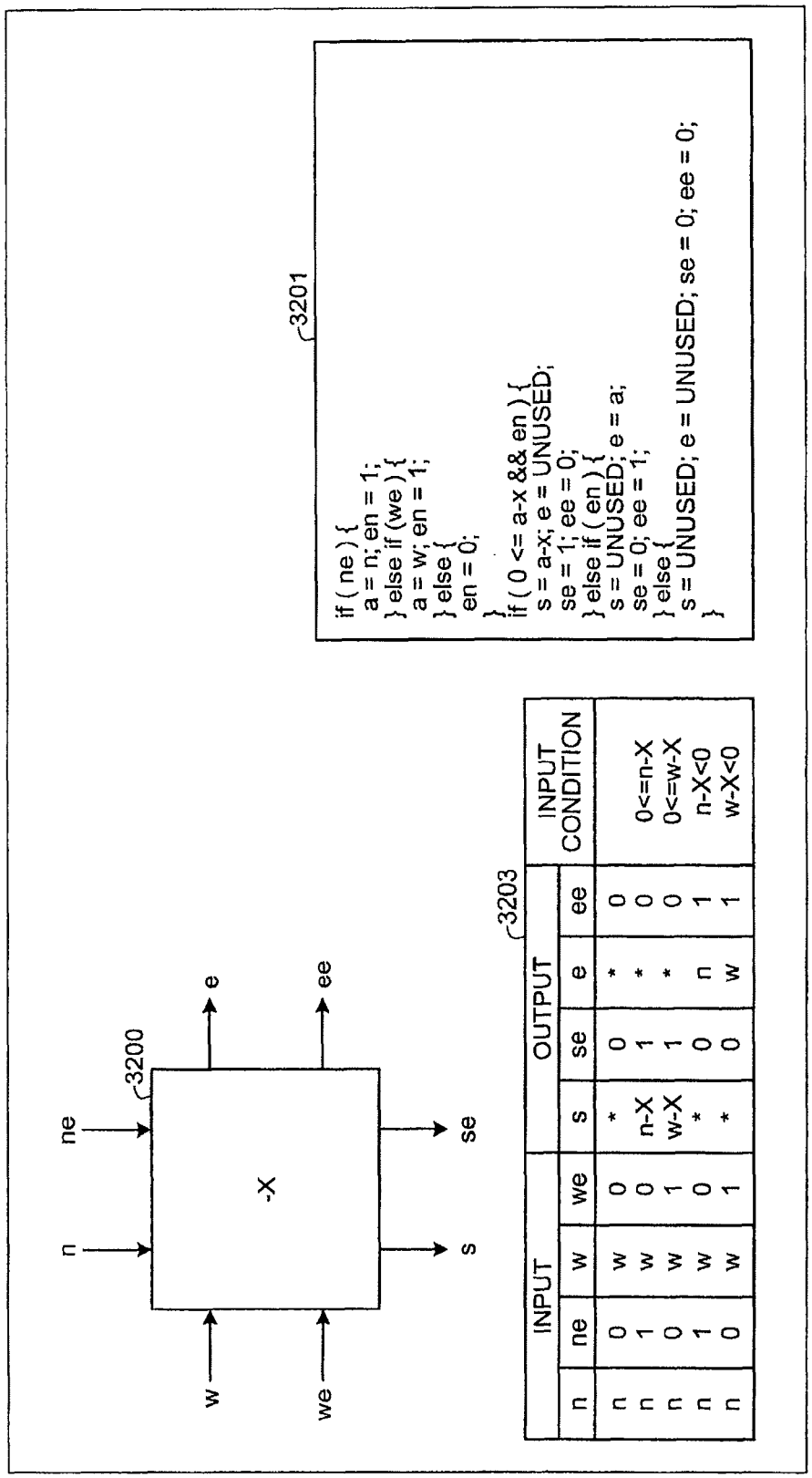
FIG. 32 is a schematic of an example of an arithmetic circuit.

FIG. 32 is a schematic of an example of the arithmetic circuit. An arithmetic circuit 3200 with "−X" subtracts X from input data. n, ne, w, and we are inputs of the arithmetic circuit 3200, while e, ee, s, and se are outputs. n and w are signal lines for receiving the defective-cell position data coded according to the coding technology 3 or the result of calculation performed by an arithmetic circuit connected to the arithmetic circuit 3200, while ne and we represent enable signals output from an arithmetic circuit connected to the arithmetic circuit 3200. s and e are signal lines for outputting the result of calculation performed by the arithmetic circuit 3200, and se and ee are enable signals for selectively outputting the result of calculation to s or e, respectively.

An exemplary HDL description 3201 represents the arithmetic circuit 3200 in HDL description. For easy understanding of the exemplary HDL description 3201, details of a process performed by the arithmetic circuit 3200 are depicted in a table 3203 that includes columns of input, output, and input condition.

For example, the arithmetic circuit 3200 calculates n−X if ne is 1, and if n−X≥0, sets se to 1 and outputs the result of calculation of n−X to s. The arithmetic circuit calculates n−X if ne is 1. If n−X<0, the arithmetic circuit 3200 sets se to 0, s to "don't care," ee to 1, and e to n.

Figure 33:
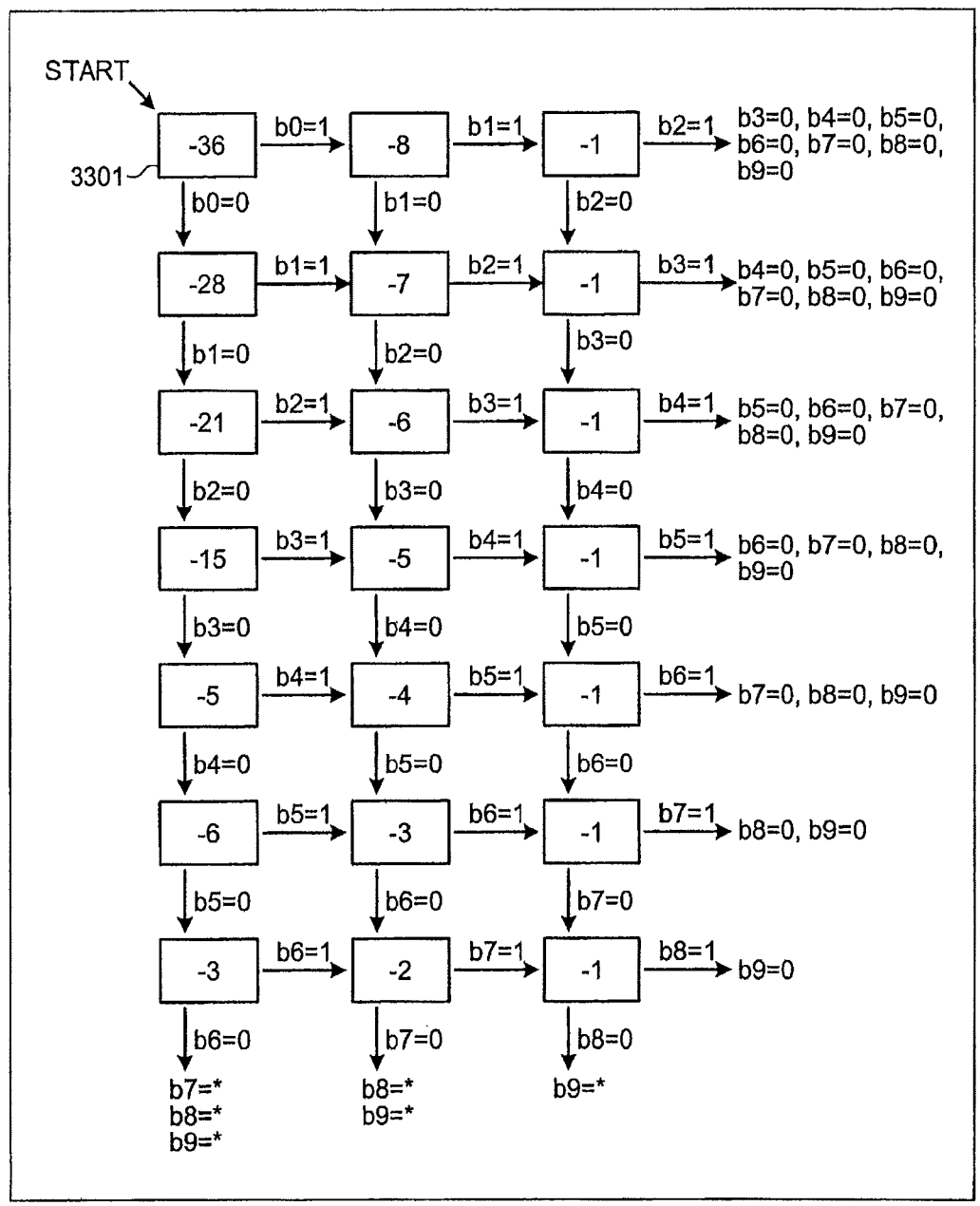
FIG. 33 is a schematic of an example of the conversion circuit 2201 concerning C(10,3).

FIG. 33 is a schematic of an example of the conversion circuit 2201 concerning C(10,3). In FIG. 33, the value of −X when n is 10 and k is 3 is depicted in each arithmetic circuit. −X=−C(10−1,3−1) and −X=−36 in the upper-left arithmetic circuit 3301.

Figure 34:
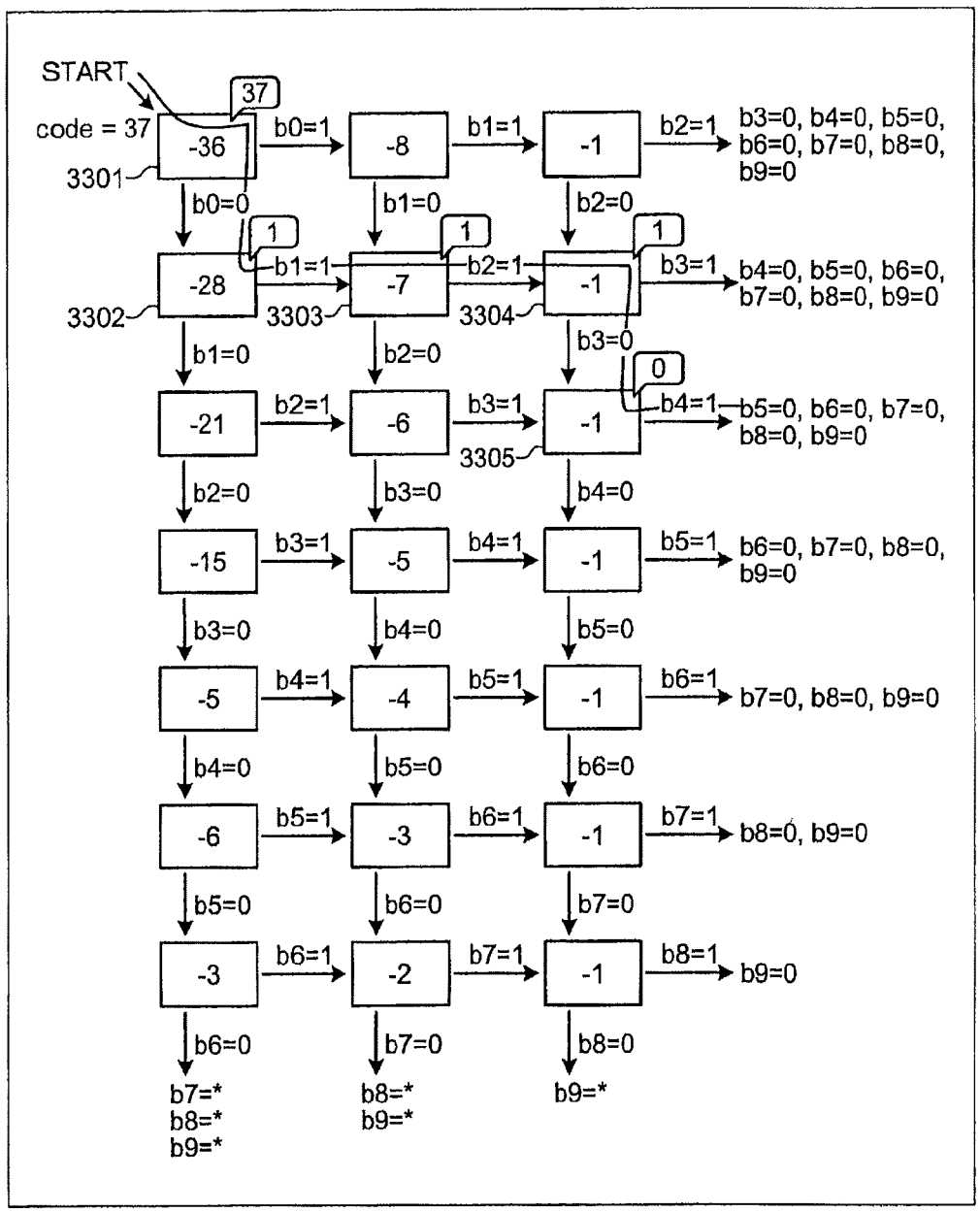
FIG. 34 is a schematic of an example of conversion performed by the conversion circuit 2201.

FIG. 34 is a schematic of an example of conversion performed by the conversion circuit 2201. A case in which the defective-cell position data coded according to the coding technology 3 is 37 is taken as an example. 37 is input from n of the upper-left arithmetic circuit 3301 that calculates 37−36, and sets se to 1, s to 1, e to "don't care," and ee to 0 since the result of calculation is 1. b0 becomes 0. An arithmetic circuit 3302 calculates 1−28, and sets se to 0, s to "don't care," e to 1, and ee to 1 since the result of calculation is −27. b1 becomes 1.

An arithmetic circuit 3303 calculates 1−7, and sets se to 0, s to "don't care," e to 1, and ee to 1 since the result of calculation is −6. b2 becomes 1. An arithmetic circuit 3304 calculates 1−1, and sets se to 1, s to 0, e to "don't care," and ee to 0 since the result of calculation is 0. b3 becomes 0. An arithmetic circuit 3305 calculates 0−1, and sets se to 0, s to "don't care," e to 0, and ee to 1 since the result of calculation is −1. b4 becomes 1, and b5 to b9 become 0.

Thus, {b0,b1,b2,b3,b4,b5,b6,b7,b8,b9} is {0,1,1,0,1,0,0, 0,0,0}. b0 to b9 are the defective-cell position data coded according to the coding technology 1.

Figure 35:
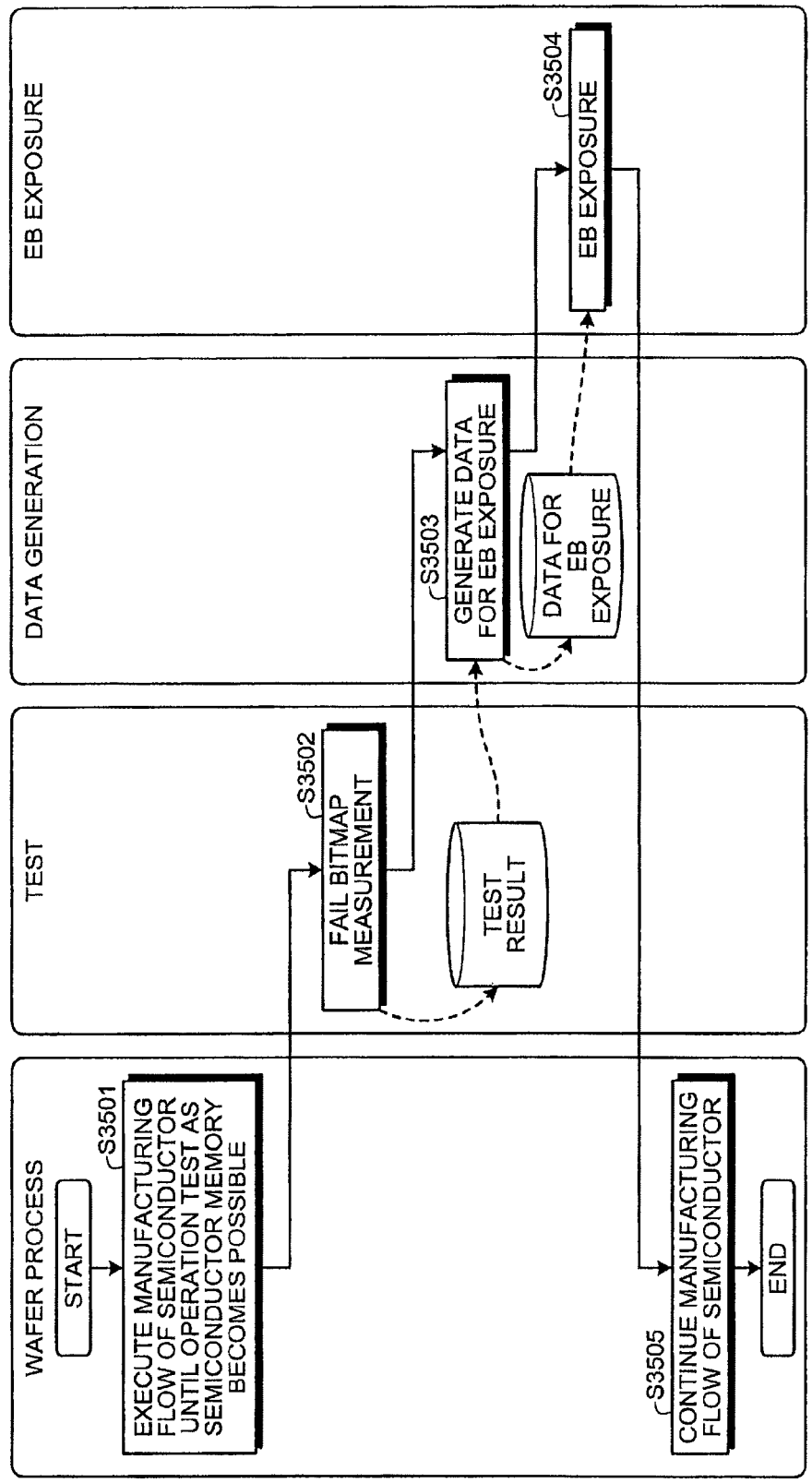
FIG. 35 is a schematic of a sequence of manufacturing method according to a third embodiment.
Figure 36:
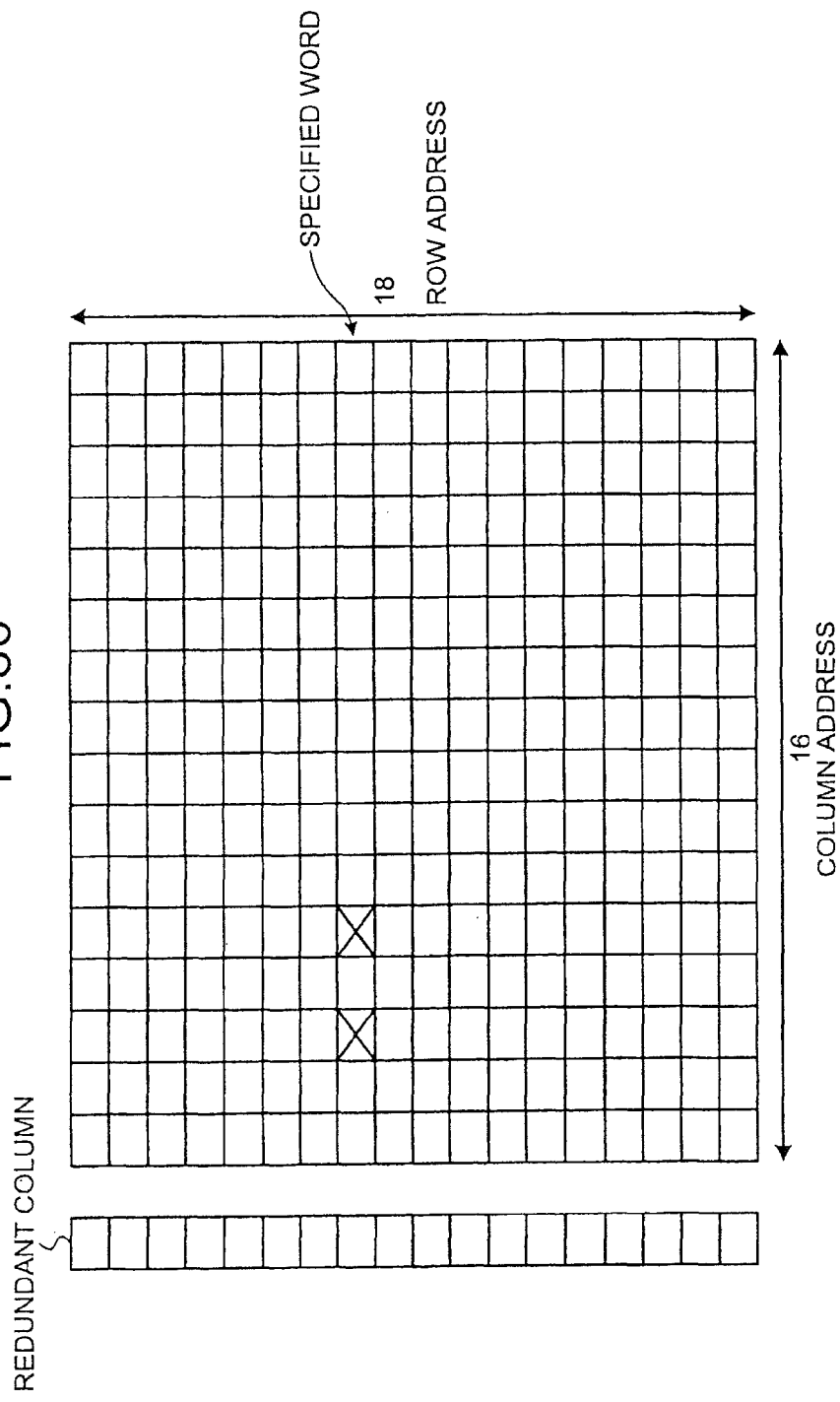
FIG. 36 is a schematic of an example of a conventional art 2.
Figure 37:
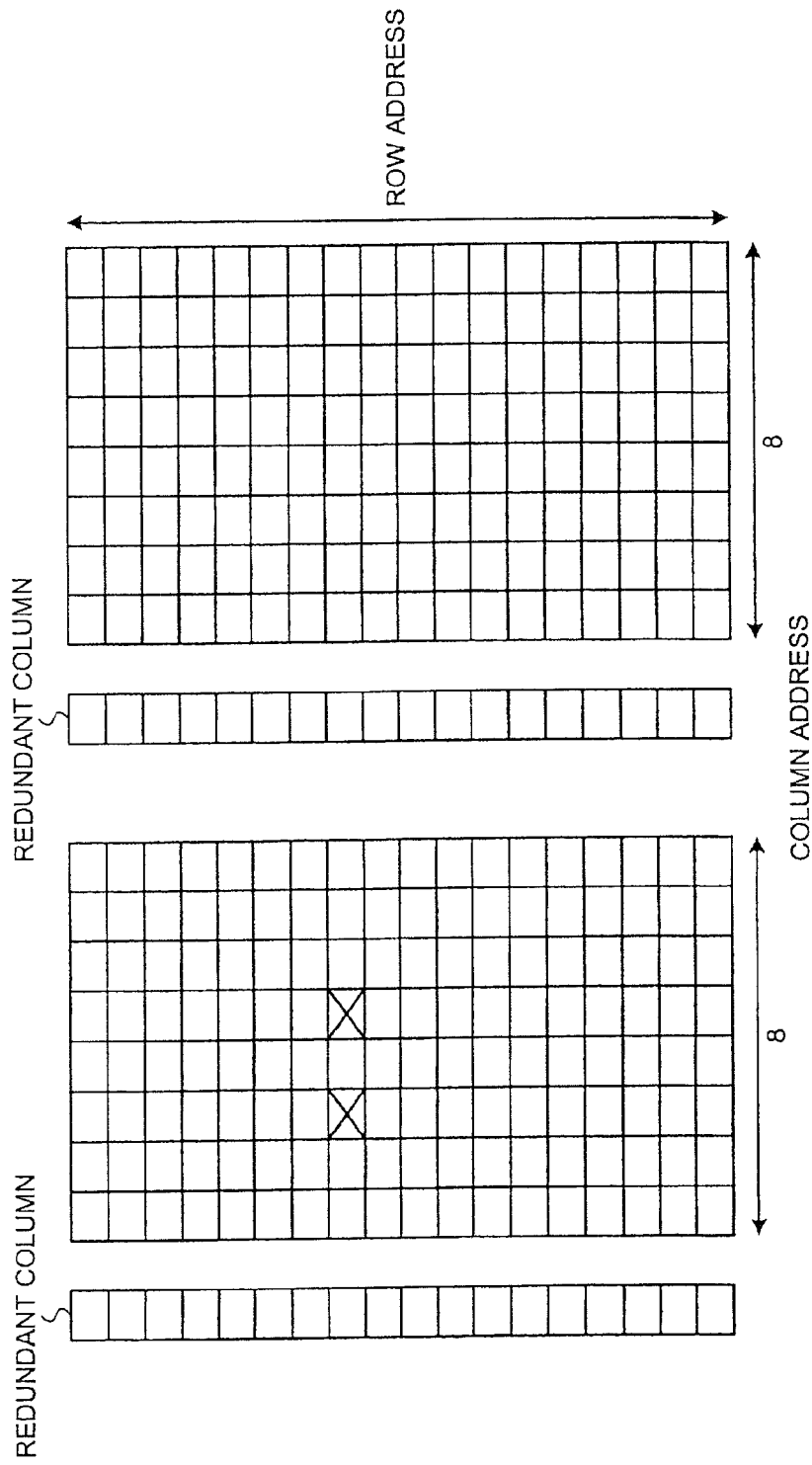
FIG. 37 is a schematic of another example of the conventional art 2.

FIG. 35 is a schematic of a sequence of manufacturing method according to the third embodiment. In the wafer process, a manufacturing flow of a semiconductor is executed until a semiconductor manufacturing device can be subjected to an operation test as a semiconductor memory (step S3501). In the test, the semiconductor testing device performs FAIL BITMAP measurement of the memory cell array 102 in the semiconductor memory (step S3502). FAIL BITMAP measurement means read/write of each word in the memory cell array 102, for example. Thus, a test result indicating which cell is defective can be obtained.

In the data generation, data for electron beam (EB) exposure are generated by hand or by a computer based on the test result (step S3503). For example, the defective-cell position data are coded by hand or by a computer based on the test result, and converted into data readable by an EB exposure device. In the EB exposure, the EB exposure device writes the defective-cell position data into the position-data storage unit 103 by EB exposure based on the data for EB exposure (step S3504). For example, the EB exposure device determines whether to connect the wiring that determines whether 0 or 1 is stored in the memory cell of the position-data storage unit 103 to the source voltage by determining whether to draw a via hole. In the wafer process, the semiconductor manufacturing device continues the manufacturing flow of the semiconductor (step S3505), thereby ending the sequence of processes.

The semiconductor memory according to the first embodiment can recover data of any defective cell(s) of any word(s) by reading, based on the defective-cell position data, data from cells that are data cells and redundant cells other than a defective cell(s) and have the bit width of data cells, thereby increasing the number of defective cells replaceable with redundant cells without increasing the circuit size, and thus improving the yield rate (i.e., y≥2).

Further, the semiconductor memory can increase the number of defective cells replaceable with redundant cells by replacing, based on the defective-cell position, write data having the bit width of data cells with data of data cells and redundant cells.

If the defective rate of each cell p=1.0e−8, the probability of cells of 10 Mbits in a semiconductor memory operate normally is $(1-1.0e-9)^{\wedge}10e6$, where "^" indicates exponents. That is, p≈99%. If up to 1 defective cell among cells of 10 Mbits can be replaced with the redundant cell, the probability that the cells of 10 Mbits in the semiconductor memory operate normally is 99.995%. In this case, the probability of normal operation increases compared to a case in which none of defective cell(s) can be replaced with redundant cell(s). The probability that cells of 10 Mbits in a semiconductor memory operate normally is the probability when all cells of 10 Mbits are normal plus the probability when one of the cells of 10 Mbits is a defective cell, that is, $(1-p)^{\wedge}N+p^{\wedge}1*(1-p)^{\wedge}(N-1)*C(N,1)$=99.995%.

If up to 2 defective cells among cells of 10 Mbits can be replaced with redundant cells, N=10e6+2. In this case, the probability when all cells of 10 Mbits are normal is 99.99998% $(=(1-p)^{\wedge}N+p^{\wedge}1*(1-p)^{\wedge}(N-1)*C(N,1)+p^{\wedge}2*(1-p)^{\wedge}(N-2)*C(N,2))$. Thus, in this case, the probability of normal operation is improved compared to a case in which only one of the defective cells is replaced with a redundant cell.

For example, if the defective rate of each cell p=1.0e−8 and up to 2 defective cells can be recovered among cells of 10 Mbits in a semiconductor memory, the probability that the semiconductor memory operates normally is 99.53%. For example, if the defective rate of each cell p=7.17791029836157e−7 and up to 54 defective cells can be arbitrarily compensated among cells of 10 Mbits, the probability that the semiconductor memory operates normally is 99.8%. If it is targeted that a memory macro of 10 Mbits operates at the rate of 99%, the target can be achieved by increasing the number of replaceable defective cells even when the defective rate of each cell increases. Thus, the semiconductor memory according to the present invention can recover defective cells even when the defective rate of each cell becomes one million times as high as the previous defective rate.

Further, the circuit size can be reduced by combining the read circuit and the write circuit into a single circuit by logic synthesis.

In one example of the semiconductor memory described in the second embodiment, the defective-cell position data stored in the position-data storage unit are data indicating what number bit(s) is a defective cell(s) in the specified word. Thus, the defective-cell position data can be compressed, thereby reducing the circuit size.

In another example of the semiconductor memory described in the second embodiment, the defective-cell position data stored in the position-data storage unit are the combination number indicating bit position(s) of defective cell(s). Thus, the defective-cell position data can be compressed, thereby reducing the circuit size.

Further, the circuit size can be reduced by combining the read circuit and the conversion circuit into a single circuit by logic synthesis.

Further, the circuit size can be reduced by combining the write circuit and the conversion circuit into a single circuit by logic synthesis.

Further, the circuit size can be reduced by combining the read circuit, the write circuit, and the conversion circuit into a single circuit by logic synthesis.

The manufacturing method according to the third embodiment is executed until data can be read from/written into a memory cell array of the semiconductor memory according to the first or the second embodiment, and the memory cell array is tested during manufacturing to identify defective cell(s). Position data of the specified defective cell(s) are written into a position-data storage unit of the semiconductor memory by an EB exposure performed by an EB exposure device. This method can reduce the circuit size compared to other method of replacement to redundant cell using fuse circuit. For example, the circuit size increases only by the area of increased redundant cells. Further, by switching from the method using fuse circuit to the method using EB exposure, redundant cells can be increased by the region occupied by the fuse circuit, and thus the number of defective cells that can be compensated can be increased.

To solve the problems of conventional arts described above, the semiconductor memory can increase the number of defective cells replaceable with redundant cells, and thus increase the yield rate. The manufacturing method can reduce the size of the semiconductor memory.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory comprising:
  a memory cell array that includes data cells of x bits and redundant cells of y bits for each of a plurality of words;
  a position-data storage unit that stores, for each word, defective-cell position data of defective cells of the data cells and the redundant cells;
  a conversion circuit that converts, if the defective-cell position data for a specified word stored in the position-data storage unit are a combination number indicating any one of N combinations of bit positions of the defective cells, where $N=C(x+y, 0)+C(x+y, 1)+(C(x+y, 2) \ldots +C(x+y, y)$, the combination number into a bit string of x+y bits indicating whether cells of the specified word are defective, C representing the number of combinations of defective cells among the data cells and the redundant cells; and
  a read circuit that reads data from cells of x bits based on the bit string of x+y bits converted by the conversion circuit for the specified word.

2. The semiconductor memory according to claim 1, wherein the read circuit and the conversion circuit are combined into a single circuit by logic synthesis.

3. The semiconductor memory according to claim 1, wherein a code of the defective-cell position data is represented by k bits.

4. The semiconductor memory according to claim 3, wherein k is smaller than x+y.

* * * * *